United States Patent
Nazarian et al.

(10) Patent No.: US 9,734,011 B1
(45) Date of Patent: Aug. 15, 2017

(54) TWO-TERMINAL MEMORY SET FEATURES TYPE MECHANISMS ENHANCEMENTS

(71) Applicant: Crossbar, Inc., Santa Clara, CA (US)

(72) Inventors: Hagop Nazarian, San Jose, CA (US); Kuk-Hwan Kim, San Jose, CA (US)

(73) Assignee: CROSSBAR, INC., Santa Clara, CA (US)

( * ) Notice: Subject to any disclaimer, the term of this patent is extended or adjusted under 35 U.S.C. 154(b) by 156 days.

(21) Appl. No.: 14/641,878

(22) Filed: Mar. 9, 2015

Related U.S. Application Data

(60) Provisional application No. 62/059,774, filed on Oct. 3, 2014.

(51) Int. Cl.
- *G06F 11/10* (2006.01)
- *G06F 3/06* (2006.01)
- *G11C 29/08* (2006.01)
- *G11C 29/04* (2006.01)

(52) U.S. Cl.
CPC ........ *G06F 11/1072* (2013.01); *G06F 3/0619* (2013.01); *G06F 3/0659* (2013.01); *G06F 3/0688* (2013.01); *G11C 29/08* (2013.01); *G11C 2029/0407* (2013.01)

(58) Field of Classification Search
CPC .. G06F 11/1072; G06F 3/0619; G06F 3/0659; G06F 3/0688
See application file for complete search history.

(56) References Cited

U.S. PATENT DOCUMENTS

| | | | | |
|---|---|---|---|---|
| 8,250,282 | B2 * | 8/2012 | Confalonieri | G06F 3/0607 711/100 |
| 2008/0306723 | A1 * | 12/2008 | De Ambroggi | G11C 11/005 703/21 |
| 2009/0158918 | A1 * | 6/2009 | Norman | G11C 5/04 84/603 |
| 2009/0248962 | A1 * | 10/2009 | Kim | G06F 12/0246 711/103 |
| 2010/0218073 | A1 * | 8/2010 | Kang | G06F 11/1048 714/764 |
| 2011/0128766 | A1 * | 6/2011 | Parkinson | G11C 7/10 365/63 |
| 2011/0188282 | A1 * | 8/2011 | Chevallier | G11C 5/02 365/51 |
| 2012/0020142 | A1 | 1/2012 | Yu et al. | |
| 2012/0137058 | A1 * | 5/2012 | Hanzawa | G11C 13/0004 711/103 |
| 2012/0155162 | A1 * | 6/2012 | Hanzawa | G11C 7/1039 365/163 |

(Continued)

OTHER PUBLICATIONS

Office Action dated Oct. 4, 2016 for U.S. Appl. No. 14/642,205, 28 pages.

(Continued)

*Primary Examiner* — Ryan Bertram
(74) *Attorney, Agent, or Firm* — Amin, Turocy & Watson, LLP

(57) ABSTRACT

Operating characteristics associated with non-volatile two-terminal memory can be modified post-fabrication, e.g., by a controller that controls the non-volatile two-terminal memory. As a result, two-terminal memory arrays included in memory devices (e.g., memory cards, solid-state drives, etc.) can be flexibly modified to provide numerous advantages over other types of non-volatile memory.

27 Claims, 12 Drawing Sheets

(56) References Cited

U.S. PATENT DOCUMENTS

| | | | | |
|---|---|---|---|---|
| 2012/0208595 A1* | 8/2012 | Norman | ............. | G06F 12/0238 |
| | | | | 455/556.2 |
| 2013/0279246 A1* | 10/2013 | Lee | ................... | G11C 13/0004 |
| | | | | 365/163 |
| 2015/0074486 A1* | 3/2015 | Gaertner | ............ | G06F 11/1068 |
| | | | | 714/758 |
| 2016/0062656 A1* | 3/2016 | Ramaraju | ............. | G11C 16/10 |
| | | | | 711/103 |

OTHER PUBLICATIONS

Intel Corporation, "Open NAND Flash Interface Specification," Apr. 2, 2014, 315 pages.

Office Action dated Feb. 6, 2017 for U.S. Appl. No. 14/642,205, 21 pages.

* cited by examiner

EXAMPLE FEATURE PARAMETER DEFINITIONS ← 200

| Feature Address | Description |
|---|---|
| 00h | Reserved |
| 01h | Timing Mode |
| 02h | NV-DDR2/NV-DDR3 Configuration |
| 03h-0Fh | Reserved |
| 10h | I/O Drive Strength |
| 11h-2Fh | Reserved |
| 30h | External Vpp Configuration |
| 31h-4Fh | Reserved |
| 50h | EZ NAND Control |
| 51h-57h | Reserved |
| 58h | Volume Configuration |
| 59h-5Fh | Reserved |
| 60h | BA NAND: Error Information |
| 61h | BA NAND: Configuration |
| 62h-7Fh | Reserved |
| 80h-FFh | Vendor Specific |

FIG. 2

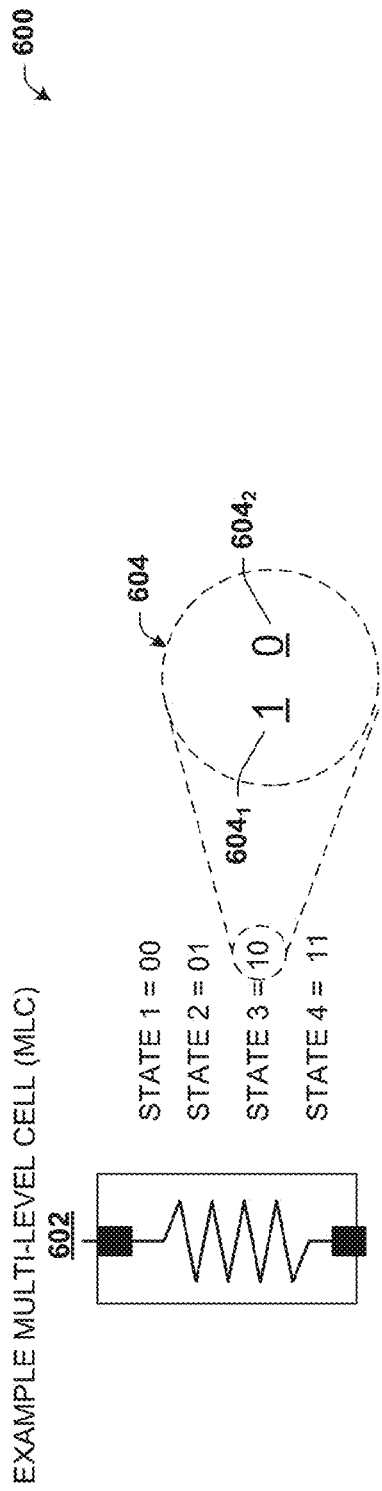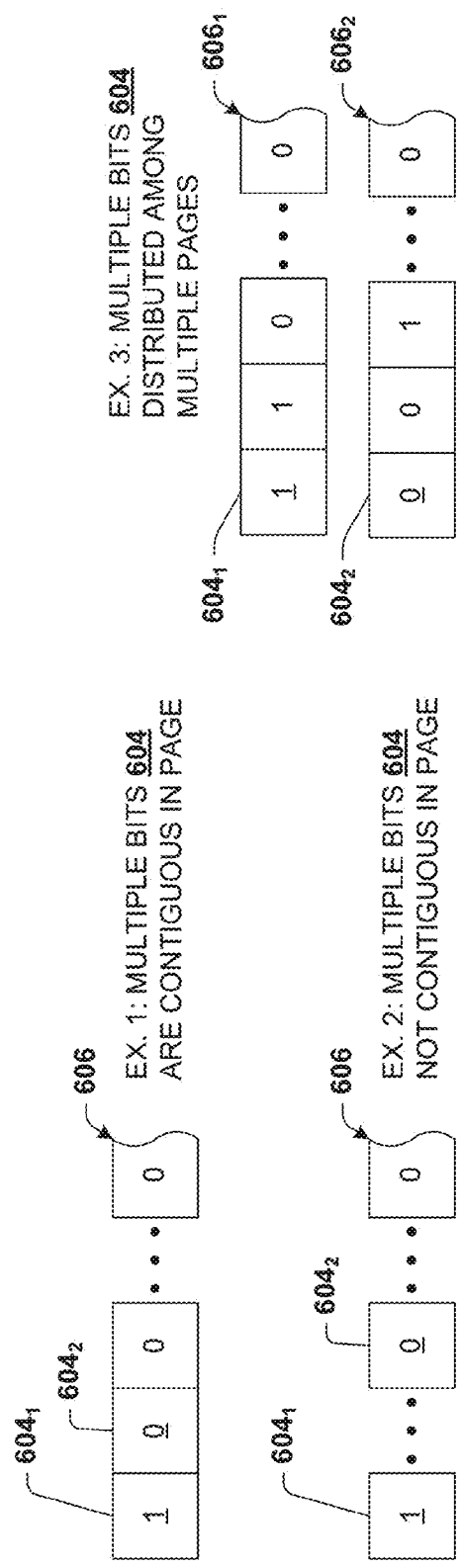
FIG. 6

TWO-TERMINAL MEMORY SET FEATURES TYPE MECHANISMS ENHANCEMENTS

CROSS-REFERENCE TO RELATED APPLICATION(S)

The subject application claims the benefit of U.S. Provisional Patent Application Ser. No. 62/059,774, entitled "TWO-TERMINAL MEMORY COMPATIBILITY WITH OR ENHANCEMENT TO NAND FLASH MEMORY SET FEATURES TYPE MECHANISMS" and filed Oct. 3, 2014, which is incorporated by reference herein its entirety and for all purposes.

TECHNICAL FIELD

This disclosure generally relates to providing compatibility for or enhancement to Get Feature or Set Feature operations associated with identifying or configuring NAND flash memory operating characteristics in connection with (non-NAND) two-terminal memory.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventor(s) believe that arrays of many such memory cells, can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology including emulation of transistor-based memory applications. For instance, resistive-switching elements are often theorized as viable alternatives, at least in part, to metal-oxide semiconductor (MOS) type memory transistors employed for electronic storage of digital information. Underlying physics of resistive-switching memory devices provide some potential technical advantages over non-volatile MOS type FLASH memory transistors.

In light of the above, the inventor(s) desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides for a two-terminal memory device configured to be programmed to one of a set of operational states via post-fabrication programming. In some embodiments, the two-terminal memory device can be programmed to an operational state configured to emulate NAND-based memory. Emulation of NAND-based memory with two-terminal memories enables various advantages of two-terminal memory to be realized by a NAND-based memory device, with little or no reprogramming of the NAND-based memory. In some embodiments, the two-terminal memory device can be programmed to operate with a two-terminal host device, disabling emulation of NAND, to provide most or all of the advantages of two-terminal memory. In other embodiments, a two-terminal memory device can be programmed to emulate NAND Get/Set Features capabilities, including post-fabrication programming to operate according to a vendor-specific mode of operation, and others. NAND emulation can include implementing read, write or erase operations according to NAND specifications, while utilizing configurable page features capabilities of two-terminal memory. Various embodiments therefore improve access times, lower power consumption, provide more flexible or more dynamic operation, or the like, among others.

Devices disclosed herein relate to a memory device (e.g., a memory card, solid-state drive, etc.) comprising one or more memory modules. Memory module(s) can include an array of non-volatile two-terminal memory cells that have different operating characteristics from conventional NAND flash memory. The memory device can further comprise a controller that can be configured to set two-terminal memory post-fabrication operational characteristics for the one or more memory modules. Setting these two-terminal memory operational characteristics can be in response to a configuration command.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

FIG. 2 depicts an example illustration of example Feature parameter definitions that are provided and/or relate to NAND flash memory devices in accordance with certain embodiments of this disclosure.

FIG. 6 illustrates a block diagram of an example multi-level cell (MLC) and various examples of an associated MLC pagination scheme in accordance with certain embodiments of this disclosure.

DETAILED DESCRIPTION

Introduction

Figure 1:
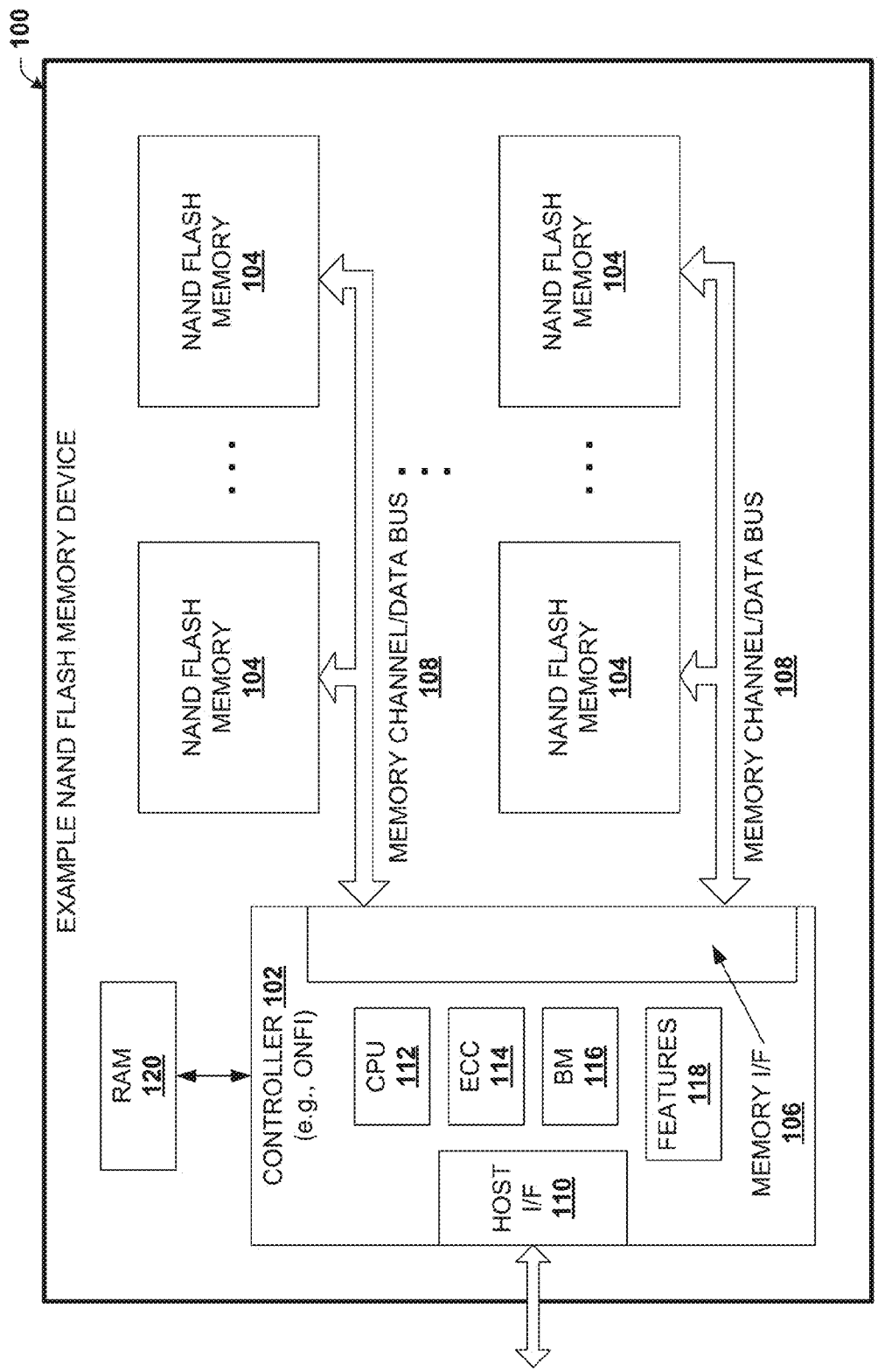
FIG. 1 illustrates a block diagram of an example NAND flash memory device in accordance with certain embodiments of this disclosure.

Embodiments of this disclosure relate to mechanisms for setting operational characteristics of memory arrays. For example, such mechanisms can emulate existing NAND flash memory Set Features functions or provide other operational characteristic modification that can be tailored for non-NAND two-terminal memory.

NAND flash memory is a non-volatile computer storage device utilized to store information for computing devices such as personal computers, laptops, smart phones, cameras, gaming consoles and so on. Since NAND flash memory is non-volatile, NAND flash memory is primarily used for memory cards, removable memory devices, solid-state drives or the like, but is also used in some applications or computing devices as main memory or other applications typically associated with volatile memory.

The inventor(s) of the subject disclosure view flash memory technology as having two primary distinct logical architectures, the NAND architecture and the NOR architecture, both based on different arrangements of semiconductor transistors. Each of the logical architectures has different attributes, including advantages and drawbacks, with respect to the other. NAND is the most commonly used in consumer memory applications, largely because of its memory density and low cost.

As previously introduced, NAND flash memory is employed for compact devices, USB devices, SD cards, solid state drives (SSDs), and storage class memory, as well as other form-factors. NAND has proven a successful technology. As technology has scaled down below 72 nanometer (nm) memory cell technology for NAND, the inventor(s) of the present application believe that structural and electrical problems will arise. For instance, bit error rates (BERs) will increase significantly, while memory cycling (related to memory endurance) will decrease.

In addition to difficulties associated with scaling to smaller technologies, NAND flash memory has some inherent drawbacks as well. NAND flash memory is architecturally divided into blocks with storage capacity generally on the order of a few megabytes (MB). Each block is divided into pages that are addressed by individual wordline operations. A block can include many pages (e.g., 128, 256, etc.), each of which can be, for example, 512 bytes, 4 kilobytes, or more. One limitation of NAND flash memory technology is that programming or writing data is performed at the page level, i.e., to change any single data bit on a page, an entirely new page of data (with the changed bit) has to be written into the NAND memory. Another limitation with NAND memory is that erasing data must occur at the block level, i.e., to erase any single data bit within a block, every single bit within the entire block of data has to be erased for the NAND memory. In this regard, a page of memory (e.g., memory cells connected to a single global wordline of a memory device, e.g., four kilobytes (kB)) cannot be directly altered or rewritten without first erasing an entire block of the memory that may include hundreds of pages of data. Furthermore, multiple block-processes are involved in rewriting the page of memory. As an example, altering a page of memory can involve first backing up the block of data in which the page of memory resides, next erasing the block, and then writing the backed-up data—including revisions to the page of memory—back to the block of data. As this example illustrates, NAND flash memory cannot be updated without first being erased, regardless of memory granularity (e.g., block, page, word, byte, bit, etc.).

With some NAND memories, to continue the above page overwrite example, reducing program/erase (P/E) cycles for the block of memory can involve writing the backed-up data with revisions to the page of memory to a second block of memory, other than the block in which the page resides. In other words, the revised block of data is simply written to a different block. Such cases involve writing to two blocks of memory, while removing the erase process to the first block. It reduces overall memory operations involved in overwriting the page of memory from initially, at least two block operations (e.g., erasing the block, re-writing the block), to one block operation (e.g., writing to the second block). However, if the first block is to be used later, then it must be erased, typically in connection with garbage collection procedures. In this case, a logical to physical (L2P) mapping table is maintained and updated by a memory controller to keep track of the new location of the backed-up data with revisions. A drawback is that the L2P mapping increases controller overhead, including memory and processes, and increases requisite controller circuitry.

In addition to the foregoing, NAND flash memory does not generally have a high program/erase (P/E) cycle count before degradation. As a result, NAND devices often incorporate wear leveling schemes to reduce P/E cycles for a given block(s) of memory, or spread the P/E cycles among most or all blocks of a memory device. The wear-leveling algorithm attempts to equalize a number of P/E cycles across respective blocks of memory for a NAND device. This can be implemented independent of host operating commands and file system operations. An efficient wear-leveling algorithm attempts to maintain a low P/E cycle differential between the highest cycled block of memory and the lowest cycled block of memory. Drawbacks include that the wear-leveling algorithm also adds computational and management overhead as well as additional circuitry-based components.

In addition to the overhead added by wear-leveling algorithms and L2P mapping, garbage collection algorithms are commonly employed with NAND flash memory devices, particularly for smaller technology nodes that have lower endurance (e.g., P/E cycle wear capacity). In these cases, wear leveling and garbage collection algorithms are essential to increase the perceived endurance cycles. Re-writing pages or blocks of data to other locations on a chip leaves the original location with residual data. After many rewrites, whether due to host commands or wear-leveling, a significant number of blocks or pages of memory can be left with residual data. Because many NAND flash memory devices cannot overwrite memory cells without first erasing them, the garbage collection algorithms are designed to free up these pages or blocks of data by erasing them at opportune times, so that new data can be written to them.

For NAND flash memory, a write process, as well as garbage collection and wear-leveling, often involve multiple P/E cycles. The number of P/E cycles is related to a memory characteristic called write amplification (WA). WA can be viewed as a measure of efficiency of a memory controller, and is generally defined by characteristics of a memory device and of a memory controller associated with the memory device. More particularly, WA refers to a number of memory controller write processes involved in executing a single host write command to the memory. Assuming no compression, the inventors believe an ideal WA is one, which indicates a single memory controller write process for each host write command. In contrast, NAND flash memory often has a WA between three and four, reflecting the lack of direct overwrite capability and the fact that program is provided at the page level whereas erasing is performed at the block level. Because memory reliability and life are affected by increasing P/E cycles, the WA of a memory device directly affects reliability and performance of a memory device.

Yet another factor impacting storage system performance and overhead is decreasing memory cell retention, and corresponding increase in "bit error rate" (BER). As mentioned above, as semiconductor transistor technology has decreased in size (e.g., from 72 nm nodes to 20 nm nodes) there has been a correlated decrease in memory retention and increase in BER. The increased BER places further demand on error correction code (ECC) requirements for NAND flash memory. This increase in ECC demand results in an increasing number of ECC corrections for a given size memory (e.g., 1 kB), which correlates to an increase in a number of chip transistors, process cycles and power consumption associated with ECC. Further exacerbating this problem is the incorporation of more powerful digital signal processing algorithms with advanced ECC algorithms (e.g., low-density parity check (LDPC) codes). These codes can increase effectiveness of ECC corrections, but significantly adds overhead and power consumption to the components of the storage memory system. The inventor(s) of the subject disclosure have the opinion that the memory device requires more spare memory to accommodate the increased ECC demand, the controller requires more transistors, and the system requires larger capacity DRAM elements. Furthermore, the efficiency of LDPC is a sub-linear function with respect to the number of errors. Increased BER, therefore, decreases the efficiency of LDPC, and at a certain threshold LDPC becomes unfeasible such that other, less sophisticated or less efficient ECC algorithms are required by reducing the overhead associated with the advanced ECC algorithm.

In addition to the memory retention, device longevity and system overhead challenges discussed above, NAND flash memory storage systems have inherent slow page read speeds relative to other types of memories. A typical read speed for many NAND flash memory products is about 25 µs. This latency may not be suitable for newer applications, such as enterprise storage, real-time embedded memory applications, or the like. For instance, in these and other memory applications, sub-100 ns read access times are preferred. The relatively low read current of NAND flash memory (e.g., less than about 300 nanoamps (nA)) poses a problem for improving read times of this technology. Moreover, the memory architecture of NAND flash memory incorporates some inherent challenges to fast random read operation.

NAND flash memory has been a dominant technology in portable memory storage devices over recent years. The ability to effectively scale in node size, in conjunction with fast write and erase speeds, fairly good longevity and manufacturing has made NAND flash memory the most popular removable storage device in commercial and consumer markets. Though NAND flash memory has met the demand for scalability for up to 20 nm technologies, the inventor(s) of the subject application believe that other technologies will need to be developed to replace conventional NAND flash memory and other floating gate-operated transistors employed for memory applications, particularly at and below the 20 nm cell technology.

To these and related ends, the subject disclosure relates to achieving advantages that can be realized by replacing NAND flash memory that is conventionally used for computing devices with non-volatile two-terminal memory. Furthermore, various embodiments provide for post-fabrication programming (e.g., through Set Feature standards) configured to enable or disable emulation of NAND operations, with a two-terminal memory chip. The post-fabrication programming can enable a two-terminal memory chip to interface with a NAND-compliant system, when programmed to emulate NAND, and to interface to a two-terminal memory system, when programmed to operate in conjunction with two-terminal memory.

Examples of the two-terminal memory technology include resistive memory (e.g., resistive-switching memory cell), ferromagnetic memory, phase change memory, magneto-resistive memory, organic memory, conductive bridging memory, and so on. Advantageously, two-terminal memory technology can facilitate writing to and rewriting to a memory location without first erasing a block of memory in which the memory location resides. In some embodiments, a two-terminal memory chip configured to emulate NAND can respond to block erase, page write or page read commands at least in part by rewriting underlying two-terminal memory that is emulating NAND. Hence, a well-known limitation associated with NAND flash memory can be mitigated or avoided entirely by various embodiments described herein. In some aspects of the subject disclosure, disclosed memory devices can write to the memory location without first erasing the memory location. Accordingly, such memory devices can avoid garbage collection algorithms and the associated overhead costs associated with implementing a NAND program command. In addition, these memory devices can provide non-compression WA value as low as one, the ideal WA value for storage systems. Thus, another well-known limitation associated with NAND flash memory can be mitigated.

Emulating NAND flash memory of computing devices, either wholly or in part, with two-terminal memory can lead to additional advantages. For example, memory devices comprising two-terminal memory arrays can provide faster read (e.g., page read) characteristics. In at least one embodiment, a read speed of memory cells employed for the disclosed memory devices can be about 30 ns to about 1 μs. Furthermore, the memory devices can have lower BER, higher endurance and more robust cycling characteristics, alleviating constraints on ECC and wear-leveling algorithms and reducing controller overhead and power consumption. In various embodiments, the two-terminal memory technology provided for the disclosed memory can have a memory retention of about ten years or more (e.g., at 85 degrees Celsius), and cell endurance of about $1 \times 10 e^8$ P/E cycles. In still other embodiments, the two-terminal memory technology can readily scale down to 5 nm nodes, though the subject disclosure is not limited to two-terminal memory technology having this scalability, all of which represent significant advantages over NAND flash memory.

Previously, computing devices such as phones, tablets, etc, (e.g., a host) accessed the NAND flash memory chips via high-level instructions. For example, a host device operating system (OS) or associated file system architecture transmits the high-level instruction to an interface associated with the memory chips. In most cases, the board or physical memory device comprising NAND flash memory elements also includes a controller that, inter alia, operates the interface and translates this high-level instruction to one or more low-level instructions that are used to directly act on the NAND flash memory. Due to the wide variety of applications for NAND flash memory, a diversity of manufacturers, and the ubiquitous nature of NAND flash memory devices, standards arose for the low-level interface to the physical memory chips.

The most widely used standard is known as Open NAND Flash Interface Working Group (ONFI) developed by a consortium of NAND flash memory vendors and other parties. ONFI specification 4.0 was released Apr. 2, 2014 and is incorporated herein by reference. Another standard is known as Toggle Mode or Toggle, developed by one particular NAND flash memory manufacturer. Such standards are employed by the controller, e.g., for standardizing translation of high level instructions to low-level instructions associated with reading, writing, and erasing data stored on the NAND flash memory; for standardizing a physical (e.g., pinouts) interface; and for setting/identifying operating characteristics associated with the NAND flash memory device.

Setting operating characteristics of the NAND flash memory device can provide certain advantages. For example, a memory device that operates at a high power or timing setting might achieve a high level of performance. That same memory device might instead be set to achieve a lower level of performance but as a trade-off operate at lower power consumption. Therefore, a single memory device can be manufactured in large quantities to suit the needs of many different host devices by simply varying, post-fabrication, the operating characteristic settings.

ONFI specifies several standard operating modes, any one of which can be selected as a default (e.g., a default operating mode on power-on) by a manufacturer. This enables the manufacturer to provide NAND chips created by a single fabrication process, to operate in different program modes. For instance, a NAND chip can be used with different mode settings to serve the program presumptions, operational specifications or preferences of host devices in terms of timing or the like, which can effect read times, write times, power consumption, and so forth associated with the memory device. Typically, the mode is tailored and set by the manufacturer prior to shipping to a customer of the memory device.

In addition, ONFI provides "Get Features" and "Set Features" functions. The Get Features function is the mechanism the host uses to determine the current settings for a particular feature (e.g., operating characteristic of the NAND flash memory). This function shall return the current settings for the feature (including modifications that may have been previously made with the Set Features function). The Set Features function modifies the setting of a particular feature. For example, this function can be used to enable a feature that is disabled at power-on. Set Features is used to change operating characteristics such as the timing mode, data interface type, I/O drive strength, external voltage configuration, etc., any of which can be configured by accessing a designated feature addresses. Additionally, a set of feature addresses are allocated to vendor specific operational characteristics.

The inventor(s) believe that emulating conventional NAND flash memory with embodiments of the disclosed two-terminal memory can yield significant advantages in terms of both existing arrangements and future improvements. The inventor(s) also believe that transition away from NAND flash memory to two-terminal memory can be simplified or further encouraged by providing programmable compatibility with NAND flash memory controllers as well as by providing non-NAND memory devices that include two-terminal memory and an on-board controller designed to take full advantage of the two-terminal memory. Existing NAND flash memory devices typically comprise NAND flash memory and an associated on-board controller (usually compliant with ONFI or some other standard) and other elements. By providing a two-terminal memory chip that can be programmed to operate with existing NAND controllers (e.g., as specified by ONFI), NAND flash memory can be replaced with two-terminal memory without changes to the controller or other elements of the memory device. Accordingly, transition to two-terminal memory can be accomplished with minimal re-tooling, controller re-programming or other impacts on memory device manufacturers.

Additionally or alternatively, programmable modalities can facilitate post-fabrication customizable memory characteristics for a two-terminal memory chip. For instance, in some embodiments, the programmable modalities can enable a two-terminal memory chip to satisfy vendor specific operational characteristics provided in connection with ONFI (or another) specification. Vendor specific operational characteristics might include, for example, software or hardware performance settings tailored to take advantage of two-terminal memory implementations, performance settings matched to associated hardware characteristics or logical presumptions of a host device (e.g., a smart phone, tablet computer, wearable device, etc), or the like, or suitable combinations of the foregoing. Such vendor specific functions, as with other feature parameters, can be configured via a programming modality analogous to Set Features commands. Furthermore, while adding features to an existing standardized set of features does represent modification to the controller, such can be accomplished with minimal impact on manufacturers since vendor specific feature addresses are already allocated. In this regard, no or minimal re-tooling or expensive procedure is required to allow for at least a subset of functionality tailored to two-terminal memory implementations to be provided for existing electronic devices. In some embodiments, feature functionality need only be programmed, for example, via firmware updates. In at least one embodiment, feature functionality can be achieved with no additional programming, for example, where emulation is managed by an on-chip controller that communicates off-chip according to existing programming. In some embodiments, this additional functionality available through post-fabrication programming modality(ies) can be compatible with NAND flash memory as well.

For instance, existing low-level commands for NAND flash memory provide for reading, programming (e.g., writing), and erasing data, such as those standardized by ONFI. Since NAND flash memory program commands typically require a previous erase command, NAND flash memory cannot perform a direct rewrite or overwrite at a given memory location. In contrast, the disclosed two-terminal memory allows changing the state of a given memory location irrespective of a current state of that memory location. Said differently, the numeric value (e.g., "0" or "1") assigned to a given memory location in a particular state can be modified independently of the current state. Such is referred to herein as "rewriting" or "overwriting" and is generally not available with NAND flash memory since a low-level program operation for NAND flash memory involves the current state being in the erased state. A vendor specific feature address can be assigned to executing a function described as rewriting or overwriting. An associated programming modality command can activate, or set as a default, the rewrite functionality that might only be suitable for non-NAND flash memory (e.g., the disclosed two-terminal memory). However, in some embodiments the same or another programming modality command might provide the ability to toggle off the rewrite functionality and revert to NAND-based program/erase commands. Therefore, a suitably programmed controller (e.g., configured to operate in a two-terminal memory paradigm) can leverage advantages provided by disclosed two-terminal memory systems, without excluding compatibility with NAND flash controllers. In still other embodiments, the same or another programming modality command could provide the ability to emulate high-level NAND operations (e.g., read, write, erase, etc.) with low-level two-terminal memory functionality (e.g., direct write or overwrite, configurable page size, associated memory cell addressing, associated error correction algorithms, and so on), thereby providing further advantages of two-terminal memory to a legacy NAND controlled system or device. Numerous other example functions that can be accessed via two-terminal memory post-fabrication program modalities (e.g., analogous to vendor specific feature addresses accessible via Set Features commands in the NAND paradigm), are detailed herein.

In this regard, this disclosure relates to functions accessed via a mechanism analogous to ONFI standards Set Features Commands that are specified to change operating characteristics of associated NAND flash memory and/or NAND flash memory devices. In some embodiments, instead of NAND flash memory elements, two-terminal memory cells are employed for digital information storage, and are configurable post-fabrication via a set of program modalities associated with respective sets of operating characteristics, logic configurations, interface translation schemes, or the like, or suitable combinations thereof, and accessed via respective ones of a set of program modality commands. In some embodiments, the two-terminal memory cells can include a resistive technology, such as a resistive-switching two-terminal memory cells. Resistive-switching two-terminal memory cells (also referred to as resistive-switching memory cells or resistive-switching memory), as utilized herein, comprise circuit components having two conductive contacts (also referred to herein as electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a conductive layer such as TiN or a conductive silicon (Si) bearing layer (e.g., polysilicon, polycrystalline, SiGe, etc.), a resistive switching layer (RSL) having defect regions and an active metal layer for providing filament forming particles to the defect regions of RSL. The p-type or n-type Si bearing layer can include a p-type or n-type polysilicon, p-type or n-type polycrystalline SiGe, or the like. The RSL (which can also be referred to in the art as a resistive switching media (RSM)) can comprise, e.g., an undoped amorphous Si layer, a semiconductor layer having intrinsic characteristics, a Si sub-oxide, and so forth. In various embodiments, the RSM includes a number of crystalline defects or defect regions. Examples of the active metal layer can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations of the foregoing can be employed for the active metal layer in some aspects of the subject disclosure. In various embodiments, particles of the active metal layer become trapped within the defect regions of the RSM. These trapped particles are neutral metal particles that form conductive filaments within the RSM. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

The subject disclosure provides for two-terminal memory devices configured to operate according to a set of post-fabrication program modalities (e.g., such Get Features or Set Features functionality, or analogues thereof). In some aspects, the two-terminal memory can comprise 20 nanometer (nm) technology, whereas in other aspects the two-terminal memory can comprise sub-20 nanometer technology (e.g., 15 nm, 10 nm, 5 nm, and others). Moreover, the two-terminal memory can have a component area that is less than about 5 $F^2$ (e.g., about 4.28 $F^2$). In some aspects, three-dimensional stacks of two-terminal memory arrays can be provided, reducing component area. For instance, a 4.28 $F^2$ device can have an effective component area of 2.14 $F^2$ for a three-dimensional device having two stacked layers. As another example, the 4.28 $F^2$ device can have an effective component area of 1.07 $F^2$ for a three-dimensional device having four stacked layers, and so on.

In additional embodiments disclosed herein, there is provided a digital storage device comprising two-terminal memory. In some embodiments, such a digital storage device can be removably connected to a computing device (e.g., a host device). In other embodiments, the digital storage device can be integrated with the computing device (e.g., read only memory, random access memory, etc.). In particular, embodiments, the digital storage device can be a memory stick that can be connected to a host computer over a memory interface (e.g., a host interface such as a universal serial bus (USB), or other suitable interface) and can store and retrieve information, and erase stored information, in response to commands by the host device.

The inventor(s) further believe that once two-terminal memory has been demonstrated as a viable alternative to NAND flash memory in the context of NAND flash memory devices, such will justify redesign of the controller element or other memory device elements to take full advantage of two-terminal memory with or without compatibility with NAND flash memory elements, devices, or standards and example embodiments are disclosed herein.

Example Memory Devices

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, an example NAND flash memory device 100 is depicted. NAND flash memory device 100 can be a removable storage device, which can be connected to or disconnected from a host computing device (e.g., a computer, a laptop, a terminal, a smart phone, a table computer, etc.) by way of a communication interface (e.g., a universal serial bus (USB) interface, or another memory bus or interface). In some embodiments, NAND flash memory device 100 can be deployed on a hardware card for connecting with a server device or other computing device. In still other embodiments, NAND flash memory device 100 can be a stand-alone device configured to communicate with a remote host device via a suitable remote communication platform (e.g., a wireless interface, a cellular interface, a satellite interface, a wired interface, an Ethernet interface, a broadband over power line interface, or the like, or a suitable combination thereof).

NAND flash memory device 100 can comprise a controller 102. Controller 102 can operate according to defined standards such as ONFI standards. Controller 102 can be configured to communicate with a host computing device over a host interface 110. Host interface 110 can operate to receive (e.g., high-level) host commands from the host computing device related to memory modules 104 on memory device 100. Suitable host commands can include a write command, a read command, an erase command, an overwrite command, or the like, or suitable combinations thereof. Additionally, host interface 110 can be configured to receive data from the host computing device related to a host command, or provide data stored on one or more memory modules 104 to the host device in response to a host command.

In various embodiments, memory controller 102 can further comprise a memory interface 106 configured to communicate with and execute memory operations in conjunction with memory modules 104 over one or more memory channels/data busses 108 (referred to hereinafter as memory channels 108). Memory channels 108 can be 8-bit channels, 16-bit channels, or another suitable configuration. In some embodiments, memory controller 102 can perform low-level memory operations with memory modules 104, including write, erase, read, etc. in accord with the high-level host commands. In at least one embodiment, memory channels 108 can be NAND flash interfaces, conforming to a NAND flash standard or a non-standard NAND flash interface protocol (e.g., a custom or vendor-specific set of NAND flash protocols), or the like.

Memory controller 102 can further comprise a central processing unit (CPU) 112, an error correcting code (ECC) component 114, a block management (BM) component 116, Features component 118, as well as other suitable circuitry, modules, or components. CPU 112 can be configured to execute instructions associated with memory device 100. ECC component 114 can correct errors in data received from memory modules 104 based on various ECC algorithms such as, e.g., a Hamming code, a Bose-Chaudhuri (BCH) code, a Reed-Solomon (RS) code, a low-density parity check (LDPC) code, or the like. Block Management component 116 can include circuitry and logic for bad block detection and wear leveling. Bad blocks (e.g., hardware failure) can be detected during low-level operations (e.g., program or erase), at power-on, or during suitable maintenance operations. Bad block and/or wear data can be stored to allocated locations of memory modules 104 or to RAM 120 (e.g., dynamic RAM, or other suitable RAM), which can provide for temporary storage, high speed operating memory, or other purposes that would be evident to one of ordinary skill in the art, which are considered within the scope of the subject disclosure.

In addition, NAND flash memory device 100 can comprise Features component 118 that can facilitate identifying or setting various operational characteristics (e.g., program modalities) associated with memory modules 104. ONFI standards detail functions denoted as Get Features and Set Features. Get Features functions can identify current or historic settings associated with memory modules 104. Set Features functions can set operational characteristics such as timing, drive strength, etc., as well as activate certain vendor specific functions. If controller 102 is compliant with ONFI standards, then Features component 118 can include circuitry and logic associated with the ONFI Get/Set Features functions. Otherwise, Features component 118 can include circuitry and logic relating to similar functions associated with identifying or setting operational characteristics of memory modules 104 provided by another suitable post-fabrication program modality (e.g., a standard program modality, a non-standard program modality, a custom program modality, etc.).

In one or more embodiments, memory modules 104 can be two-terminal memory devices, such as resistive-switching memory, phase-change memory, and so on. In some embodiments, host commands from the host computing device can comprise NAND-compliant high-level operating commands (e.g., block erase, page write, etc.). In one embodiment(s), controller 102 can convert the high-level NAND-compliant operating commands to NAND-compliant low-level operating commands. According to this embodiment(s), on-board logic or circuitry of memory modules 104 (not depicted, but see FIG. 3, infra) can be configured to convert the NAND-complaint low-level operating command to one or more two-terminal memory functions. In another embodiment, controller 102 can be at least in part configured to convert a high-level NAND-compliant operating command to a non NAND-compliant low-level operating command. In the latter embodiment(s), on-board logic or circuitry of memory modules 104 can be configured to convert the non-NAND-complaint low-level operating command to the two-terminal memory function(s).

Turning now to FIG. 2, example feature parameter definitions 200 are provided that relate to NAND flash memory devices. Get Features functions and Set Features functions, including vendor specific functions, can be accessed via defined Feature address locations. In this example, functions relating to a timing mode can be accessed via Feature address "01h". In other words, a Get Features command with the address of "01h" can identify a current or set of recent timing modes, whereas a Set Features command with the address of "01h" can operate to set a current timing mode. Various other Feature functions can be audited or set in a like manner, and while definitions 200 illustrate many examples, other examples might exist and are considered to be in the scope of this disclosure. Furthermore, one or more Feature addresses can be associated with a particular Feature function. For instance, although depicted as being associated with a single address (e.g., "01h"), timing mode could be associated with multiple addresses. It is underscored that many vendor specific functions can be accessed, in this example via Feature addresses "80h" through "FFh".

In some embodiments, controller 102 may be non-ONFI and NAND flash memory 104 elements may be non-NAND elements. In those embodiments, Features 118 can be interpreted according to a non-NAND scheme and can be suitable or optimized for the particular type of controller 102 and/or memory 104.

Figure 3:
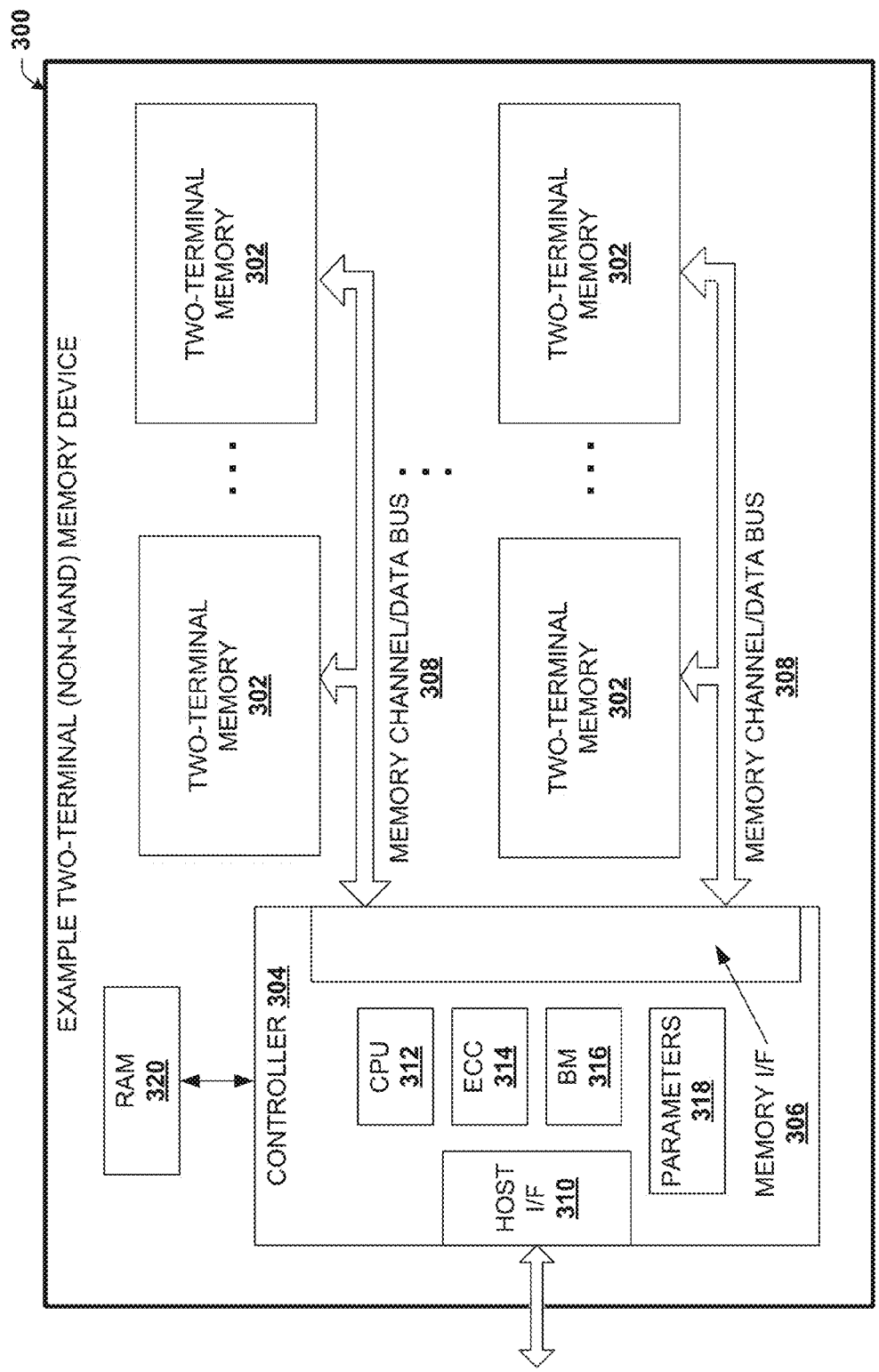
FIG. 3 illustrates a block diagram of an example two-terminal (non-NAND) memory device in accordance with certain embodiments of this disclosure.

With reference now to FIG. 3, example device 300 is depicted. Device 300 provides an example two-terminal (non-NAND) memory device with adjustable parameters that can be set post-fabrication to modify operating characteristics of the two-terminal memory. For example, device 300 can be substantially similar to device 100 of FIG. 1 in that both devices are intended to interface to a host and provide non-volatile information storage. Rather than including NAND flash memory modules 104, device 300 comprises two-terminal memory 302. Controller 304 can be substantially similar to controller 102 except that controller 304 can be constructed to specifically leverage advantages of two-terminal memory 302 and various other elements can be similar or identical. For example, elements 306-320 can function similarly to that described in connection with elements 106-120, with some differences described herein or readily identified by one of ordinary skill. For instance, because two-terminal memory 302 can have a much lower BER, ECC 314 and related logic and overhead can be simplified or reduced such as taking advantage of optimized algorithms that may not be available for corresponding ECC 114. As another example, block management 316 can be substantially streamlined versus block management 116 because NAND flash memory 104, unlike two-terminal memory 302, generally requires an erase operation prior to a write operation and defines erases to affect a different number of memory bits (i.e., a block) than a write (i.e., a page), resulting in much more complex block management. As detailed further herein, adjustable parameters 318 can be similar in function to features 118, but in some embodiments tailored specifically to a fully integrated two-terminal memory device 300 rather than compatibility with NAND-based devices, memories, or controllers.

Two-terminal memory modules 302 can comprise an array(s) of memory cells for storing digital information, control hardware for accessing and writing the information, buffering memory (e.g., RAM, or the like) to facilitate control hardware processes and memory translation operations, cache, or the like, or a suitable combination thereof. In some embodiments, the array(s) of memory cells can comprise a crossbar arrangement of two-terminal memory cells. In the crossbar arrangement, intersecting wordlines and bitlines of the memory arrays can be configured to facilitate applying an electrical signal to one or more of the two-terminal memory cells of a memory module 302. Examples of such two-terminal memory cell technology can include, but are not limited to, resistive memory cells such as resistive-switching memory, resistive random access memory, or the like, or a suitable combination thereof. Examples of the disclosed two-terminal memory cell technology can be found at FIGS. 4A and 4B. An example of a crossbar arrangement of an array of two-terminal memory cells can be found at FIG. 5.

Figure 4A:
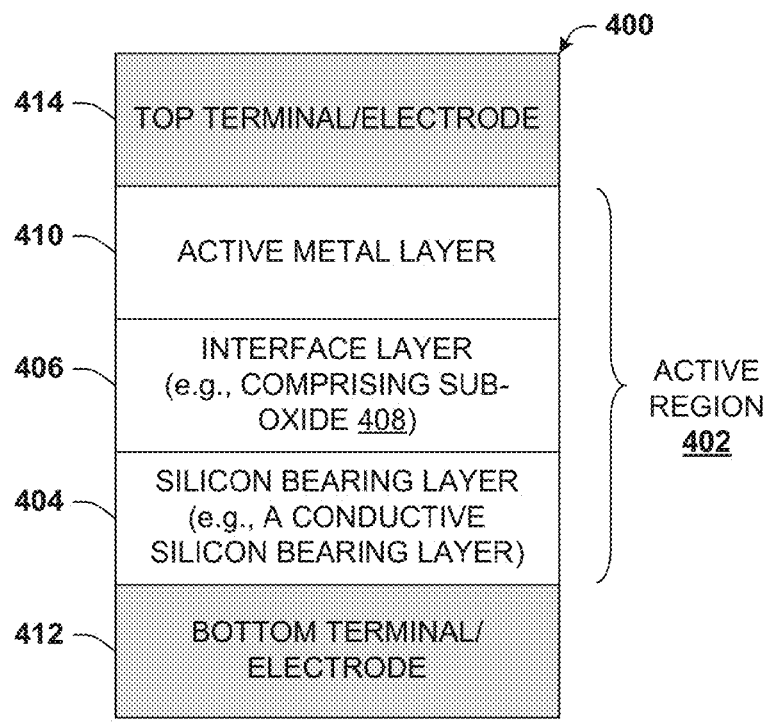
FIG. 4A depicts an example two-terminal memory cell in accordance with certain embodiments of this disclosure.
Figure 4B:
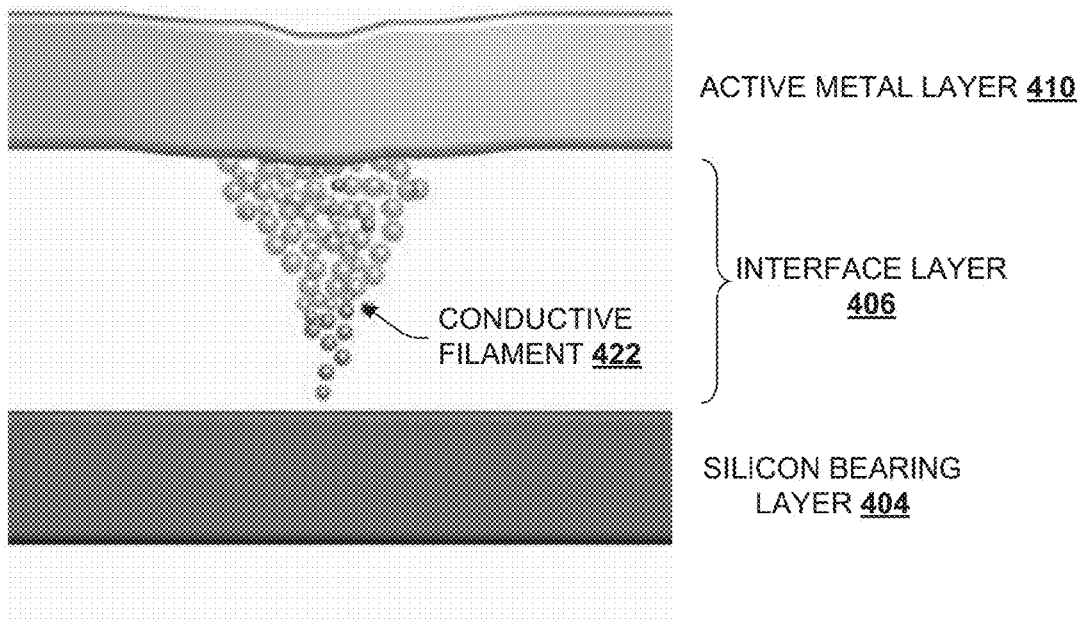
FIG. 4B depicts an example illustration that provides a cross-section of an example active region of an example two-terminal memory cell in accordance with certain embodiments of this disclosure.
Figure 5:
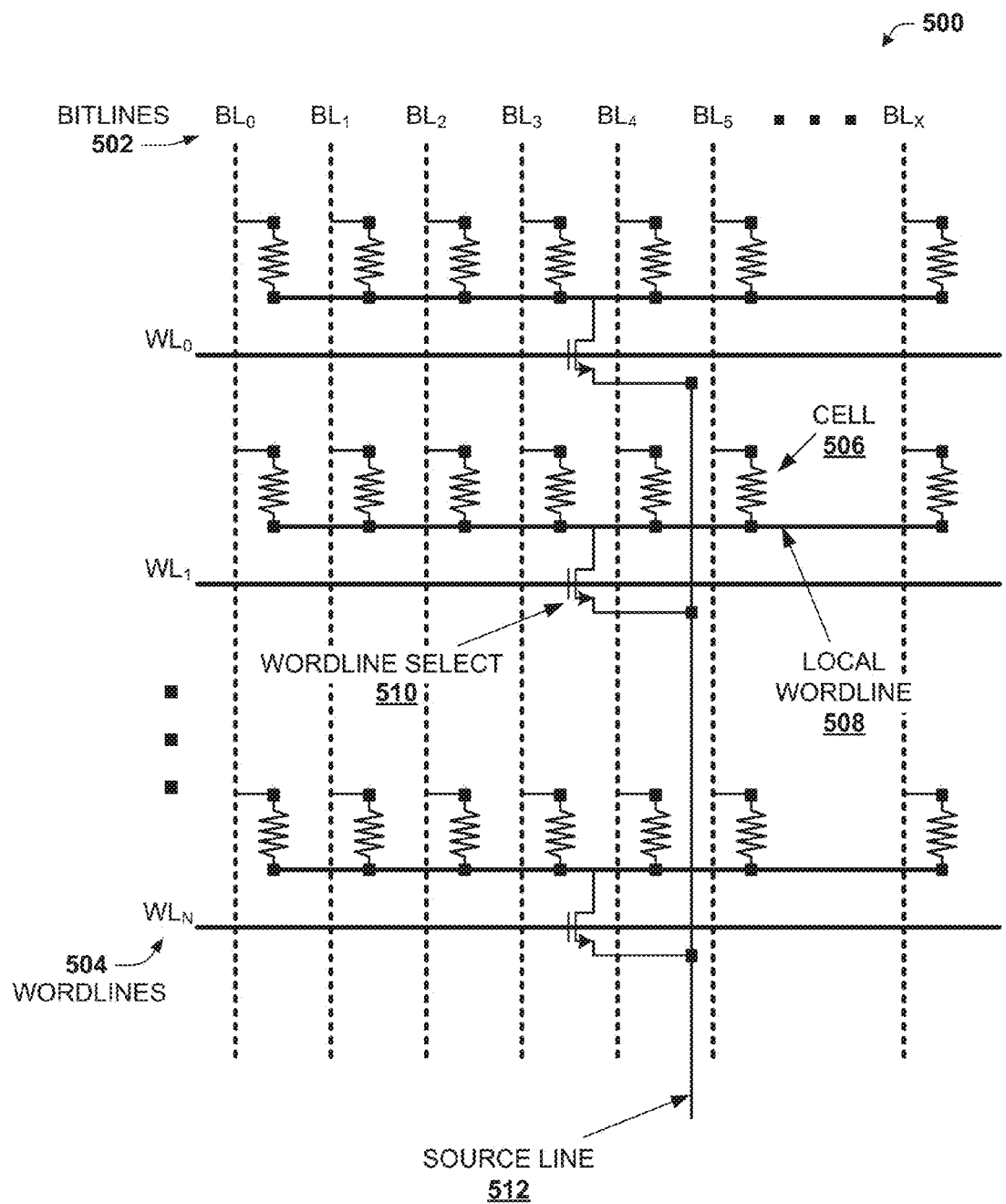
FIG. 5 illustrates a schematic diagram of an example memory architecture in accordance with certain embodiments of this disclosure.

While still referring to FIG. 3, but turning also to FIGS. 4A through 5, various examples of two-terminal memory technologies or arrangements are provided. FIG. 4A illustrates an example two-terminal memory cell 400. Cell 400 can be a resistive-switching memory device such as a resistive random access memory (RRAM) device, for which certain illustrative characteristics or aspects are provided with reference to FIG. 4B. Cell 400 may be a monolithic stack of layers and may be formed on top of an insulating substrate upon which one or more CMOS devices have been formed. In some embodiments, the CMOS devices include control transistors/control logic, or other devices (e.g. processor, logic) that may be selectively coupled to terminals of the two-terminal memory device.

The monolithic stack of layers of two-terminal memory cell 400 can include an active region 402 that can be situated between a bottom terminal 412 (e.g., one layer of the monolithic stack) and top terminal 414 (e.g., another layer of the monolithic stack). Active region 402 can be created comprising a contact layer (e.g. a metal layer, a silicon bearing layer, etc.) 404, interface layer 406, and active metal layer 410. Interface layer 406 can be composed of or comprise one or more engineered or controlled oxide(s), which is referred to herein as sub-oxide 408. Interface layer 406 can comprise a non-stoichimetric sub-oxide (e.g., sub-oxide 408) that can be a combination or mixture, possibly non-homogenous, of various silicon-based layers or elements with an aggregate chemical formula of $SiO_x$, where $0<X<2$. As another example, the aggregate chemical formula can be $Si_xGe_yO_z$, where $x≥0$, $y≥0$, $z≥0$, $x+y≤z≤2(x+y)$. In various embodiments, interface layer 406 includes multiple crystalline defects. Other examples can exist.

FIG. 4B depicts illustration 420. Illustration 420 provides a cross-section of an example active region 402 of an example two-terminal memory cell 400. In order to provide additional detail or context, it is understood that this disclosure relates to two-terminal memory cells, particularly resistive switching two-terminal memory cells, in various embodiments. Resistive switching two-terminal memory cells (also referred to as resistive switching memory cells or devices), as utilized herein, comprise circuit components having two electrical contacts (also referred to herein as electrodes or terminals) with an active region (e.g., active region 402) between the two conductive contacts (e.g., terminals 412, 414).

An example of the active region 402 of the two-terminal memory cell 400 is provided by illustration 420. This active region 402 can exhibit a plurality of stable or semi-stable resistive states, each resistive state having different electrical characteristics (e.g., resistance). Moreover, respective states of the plurality of states can be formed or activated in response to a respective voltage difference applied at the two conductive contacts. One example of a resistive switching two-terminal memory device, though not exhaustive, can include a resistive random access memory (RRAM) cell or device.

Embodiments of the subject disclosure can provide a filamentary-based memory cell. For example, in a 'programmed' or 'on' state, in response to a program voltage applied across the terminals 412, 414, ions are injected from active metal layer 410 and permeate interface layer 406 upon application of a program or write voltage, for example, which is further detailed infra. Once the program voltage is removed, the ions are trapped within the defects of interface layer 406 and become neutral metal particles. In some embodiments, the trapped metal particles form one or more conductive filament 422. One example of a filamentary-based memory cell can comprise: a conductive layer (e.g., p-type (positive) silicon bearing layer 404 TiN, or the like); the interface layer 406 (also referred to as a resistive switching layer or a resistive switching material layer), which in this case can comprise sub-oxide 408 (or other material having crystalline defects, e.g., undoped amorphous silicon), and active metal layer 410 for providing filament forming particles into the interface layer 406. The contact layer 404, e.g., p-type (or possibly n-type) silicon bearing layer 404 can include a p-type polysilicon, p-type SiGe, or the like. In other embodiments, contact layer 404 may be TiN, TaN, or other metal, conductive polysilicon, conductive polycrystalline SiGe, and so on. In some embodiments, one or more electrodes 412, 414 and conductive layer 404 may be the same material, or multiple layers. The interface layer 406 can comprise, e.g., an undoped amorphous silicon layer or mixture, a doped polysilicon layer or mixture, a doped silicon germanium layer or mixture, a semiconductor layer or mixture having intrinsic characteristics, a silicon sub-oxide layer or mixture, and so forth.

Examples of the active metal layer 410 can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing can be employed for the active metal layer 410 in some aspects. In some embodiments, an active metal layer 410 may comprise two or more layers of materials (e.g., sub-layers), such as a layer of silver, aluminum, or the like above a thin layer of oxidizable metal, e.g. titanium. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

Generally, to program one or more memory cells, a suitable program voltage can be applied across the memory cell(s) causing a conductive filament(s) or path(s) to form through a resistive portion (e.g., interface layer) of the memory cell as mentioned above. This can further cause the memory cell to switch from a relatively high resistive state, to a relatively low resistive state. An erase process can be implemented to reverse or disassociate the conductive filament(s), at least in part, causing the memory cell to return to the high resistive state from the low resistive state. This physical change of state, in the context of memory, can be associated with respective logical states of a binary bit (or of multiple bits, in the case of the conductive filament(s) being programmable to four or more distinct resistance states). Accordingly, multiple such memory cells can be programmed or erased to represent respective zeroes or ones of binary information and, by retaining those states over time, in effect persist binary information. For various reasons, in some embodiments, resistive switching memory cells are generally quick to program and responsive, changing state readily in response to a program voltage or an erase voltage. This quick switching of state is a significant advantage of various disclosed memory cells over other memory cell technologies.

As applied to illustration 420, when a suitable program voltage (e.g., a positive voltage) is applied across the terminals of two-terminal memory cell 400, ions from active metal layer 410 form and move into the adjacent interface layer 406, which is at least partially permeable to the ions that collectively form one or more conductive filament(s) 422, which although depicted as a single filament can be multiple filaments. Conductive filament 422 can span the entire thickness or a portion of the interface layer 406, facilitating increased electrical conductivity through the interface layer 406, which otherwise has a high electrical resistance. In some cases, when the program voltage is removed, the ions from the active metal layer become trapped within defect regions of interface layer 406 and become neutral metal particles.

When the conductive filament 422 forms, the memory cell is said to be in the on-state, which is a low-resistance state. For a bipolar device, in response to a suitable erase voltage (e.g., a negative voltage), conductive filament 422 can at least in part deform or retract, breaking the electrical conductive path. In some embodiments, the particles trapped within interface layer 406 move back toward active metal layer 410, thereby shortening conductive filament 422. Such is a high-resistance state, associated with an off-state. Other suitable de-programming/erase mechanisms consistent with unipolar device operation can exist for causing the off-state for a unipolar two-terminal memory. The state can be determined by measuring current through cell 400 when a suitable read voltage is applied. The read voltage generally is not sufficient (or the proper polarity) to either form or disperse conductive filament 422 (e.g., significantly disrupt the neutral metal particles trapped within the defect locations), so current readings associated with the read current can be used to determine if the cell is in the high-resistance state (e.g., off) or the low-resistance state (e.g., on). In this example, two-terminal memory cell 400 is in the on state, with conductive filament spanning a significant portion of interface layer 406, in other embodiments, the reverse convention may also be used.

FIG. 5 illustrates a schematic diagram of an example memory architecture 500 according to one or more aspects of the subject disclosure. Memory architecture 500 can be a subset of a memory array incorporated as part of a non-volatile, solid state memory storage device in some disclosed aspects (e.g., two-terminal memory 302). For example, memory architecture 500 can be a sub-block of a block of memory, where the sub-block comprises global wordlines of the block of memory, and a subset of bitlines of the block of memory that share a set of common local wordlines that are exclusive to the sub-block of the block of memory. Although memory architecture 500 is depicted with local wordlines 508 connected to respective sets of seven memory cells 506, a different number of memory cells 506 per local wordline can exist for various embodiments.

Memory architecture 500 can comprise a set of bitlines 502. Set of bitlines 502 comprises individual bitlines $BL_0$, $BL_1$, $BL_2$, ..., $BL_X$, where X is a positive integer greater than one. Intersecting set of bitlines 502 is a set of wordlines 504. Set of wordlines 504 comprises individual wordlines $WL_0$, $WL_1$, ..., $WL_N$, where N is a positive integer greater than one. In one embodiment, X can be an integer equal to 8 and N can be an integer equal to 512; however, the subject disclosure is not so limited and X and N can have other suitable values. For instance, X or N can be larger numbers where memory cells 506 comprise non-linear current-voltage characteristics (e.g., provided by a volatile selector device associated with respective memory cells 506 as described in co-pending U.S. patent application Ser. No. 13/960,735, entitled SWITCHING DEVICE HAVING A NON-LINEAR ELEMENT and filed Aug. 6, 2013, incorporated by reference herein in its entirety and for all purposes, or by another suitable mechanism for providing a non-linear current-voltage response for two-terminal memory).

As mentioned above, set of bitlines 502 can be associated with a sub-block of a block of memory, such that set of bitlines 502 share a set of local wordlines 508 that are exclusive to the sub-block of the block of memory. Respective ones of the set of local wordlines 508 are connected to a group of memory cells 506. Memory cells 506 have a first terminal connected to one of set of bitlines 502, and a second terminal connected to one of set of local wordlines 508. Local wordlines 508 are connected to a source line 512 by respective wordline select transistors 510. Each wordline select transistor 510 is positioned to electrically connect (when activated, or in a conducting state) or electrically disconnect (when deactivated, or in a resistive state) respective ones of the local wordlines 508 with/from source line 512. Respective wordline select transistors 510 can be gated transistors (e.g., single gate, floating gate, and so on) in some embodiments. Respective gates of wordline select transistors 510 are connected to and controlled by respective ones of set of wordlines 504, as depicted.

Application of a suitable electrical signal to a selected one of bitlines 502 and a selected one of local wordlines 508 can facilitate performing memory operations on a target one(s) of memory cells 506. Applying the electrical signal to the selected one of local wordlines 508 can be implemented by source line 512 and an associated one of set of wordlines 504 (e.g., see FIG. 2, infra). Memory cell operations that can be implemented utilizing the circuitry of memory architecture 500 can comprise activating, deactivating, programming, erasing, overwriting (e.g., rewriting), etc., the target memory cell(s) 506, by applying a suitable electric signal to one of bitlines 502 and one of local wordlines 508 connected to the target memory cell(s) 506 (see, e.g., FIG. 6, infra).

Still referring to FIG. 3, by utilizing a crossbar architecture of two-terminal memory cells, the inventor(s) of the subject application believe memory device 300 can provide greater flexibility in performing memory operations over NAND flash memory. For example, where the crossbar architecture facilitates individual addressing for individual memory cells, memory modules 302 can be operated to directly overwrite selected memory cells of respective arrays of memory cells. The inventor(s) believe that memory device 300 can mitigate or avoid what are, in the inventor(s) opinion, drawbacks of NAND flash memory, even for a memory device configured to operate according to NAND flash standards. Such drawbacks include, for instance, the inability of NAND flash memory to directly overwrite a memory cell without first erasing a block of memory in which the memory cell resides. Coupled with the fact that NAND flash programs or writes on the page level (e.g., one page of memory), but erases only on the block level, NAND flash is often associated with higher write amplification values (e.g., about 3 on average) than can be achieved with two-terminal memory. Since two-terminal memory can support changing the state of a memory cell(s) independently of the current state of the cell, two-terminal memory can support overwrite functions and therefore achieve an optimal non-compressed write amplification value of one. In addition to the foregoing, because two-terminal memory can support operations on a smaller number of memory cells than NAND flash (e.g., operations affecting one or more words, one or more bytes, even one or more bits, depending on two-terminal memory architecture), two-terminal memory can perform operations analogous to NAND operations at lower power, with higher performance, while maintaining greater memory cell longevity, by virtue of inherent two-terminal memory longevity characteristics, and by avoiding wasteful page write or block erase operations. The abovementioned drawbacks also lead to higher device overhead for garbage collection functions for NAND flash memory. In contrast, two-terminal memory, which is not required to follow the page-program, block-erase paradigm of NAND flash memory and further is not limited in the number of times a page can be programmed without being erased, can potentially dispense with garbage collection overhead. Another drawback is that NAND flash memory is a relatively "dirty" memory in which bit errors are relatively common and thus requires comprehensive ECC and bad block management and so on, which accounts for overhead that can be reduced with two-terminal memory arrangements. Accordingly, memory device 300 with two-terminal memory modules 302 can have significant advantages in operational efficiency, memory retention, memory endurance, read and write speeds, power consumption as well as other characteristics.

In alternative or additional embodiments of the subject disclosure, an array(s) of memory within one or more of memory modules 302 can respectively comprise multiple blocks of memory, wherein at least one of the respective blocks of memory comprise multiple sub-blocks of memory. A sub-block of memory (e.g., FIG. 5) is associated with one subset of the bitlines of an associated one of the blocks of memory. The number of the bitline subsets can vary according to different embodiments, as can the number of bitlines in a given subset of the bitlines. Each sub-block and associated subset of the bitlines has an associated set of local wordlines that can be exclusive to the sub-block. Each sub-block also comprises a number of groups of two-terminal memory cells equal to a number of wordlines of the memory modules 302. A single group of memory cells within a sub-block comprises two-terminal memory cells that are connected at one respective end thereof to one local wordline of the sub-block of memory. In addition, the memory cells of each group within a sub-block are connected at another respective end thereof to one bitline of the bitline subset of that sub-block.

The controller 304 can be configured to control operational characteristics of two-terminal memory modules 302. For example, controller 304 can translate high-level memory commands to low-level commands compatible with two-terminal memory arrays such as two-terminal memory modules 302. Such translation can relate to low-level command sets for reading, programming, and erasing as well as an active program modality (e.g., Set Features or adjustable parameter) commands. Whether accessing or modifying memory or activating post-fabrication program modality functions, a conventional NAND flash controller (e.g., controller 102) is programmed or configured to be interacting with NAND flash memory, and thus expects NAND-compliant operations, logic, acknowledgments, and the like. According to one or more disclosed embodiments, controller 304 can be configured to operate in a similar manner to control two-terminal memory modules 302.

With respect to read, program, and erase instructions, such instructions can be performed by controller 304. For example, typical NAND flash memory read or program commands operate to read or program a page of memory. Since low-level two-terminal memory commands can also read and program a page at a time (or even smaller sizes such as double words, words, bytes, nibbles, or even a single bit), such commands can be readily performed.

Moreover, since two-terminal memory supports rewrite/overwrite operations, in some embodiments, a rewrite operation can be performed to program or erase memory data. Put another way, since rewrite operations of two-terminal memory are not dependent on a current state of a particular memory cell, the rewrite command can function as both a program command and an erase command typical of NAND flash memory command sets.

With respect to Features functions such as those associated with NAND flash memory controller Get Features and Set Features functions, controller 304 can perform similar operations, described herein in connection with adjustable parameters 318. For example, consider an adjustable parameter 318 command relating to timing, which can affect clock cycles associated with performing operations as well as power characteristics. Timing settings can be adjusted to increase or decrease performance, power consumption, error rates, stability, or other characteristics. Adjustable parameters 318 can also relate to I/O drive strength, external Vpp configuration or other electrical characteristics can be set to values for operating two-terminal memory. In some embodiments, Adjustable parameters 318 can be standardized, for instance, in a manner similar to the way ONFI standards provide standardization for NAND flash memory devices.

More generally, adjustable parameters 318 can relate to programmable sets of operating characteristics to which two-terminal memory 302 can be programmed via associated post-fabrication programming modalities, similar to those utilized by standardized NAND flash memory devices (e.g., standard Get/Set Features, standard operating modes, etc.). Hence, adjustable parameters 318 can provide for certain operating characteristics or sets of operating characteristics desired by a particular manufacturer or vendor, or operating characteristics requested by a customer of the manufacturer or vendor. In the arrangement depicted by device 300, since modules 302 are two-terminal memory (rather than NAND flash memory), vendor specific adjustable parameters 318 can be leveraged to provide additional advantages or benefits. In some embodiments, adjustable parameters 318 and/or operating modes can be programmed with a post-fabrication testing device that sets the associated programming modalities.

In some embodiments, adjustable parameters 318 can relate to the concept or properties of rewriting or overwriting. NAND flash requires different operations for setting a sensed value of a particular memory cell to "0" (e.g., a program operation) than for setting the value to "1" (e.g., an erase operation). Since two-terminal memory can set the sensed value of a particular memory cell independent of that cell's current state, a single operation (e.g., rewrite/overwrite) can function as both program and erase operations utilized by NAND flash memory. Thus, one of adjustable parameters 318 can operate to specifically instruct controller 304 or memory module 302 to perform data operations according to the rewrite paradigm instead of the program-erase paradigm associated with NAND flash memory. Such can be accomplished by associated adjustable parameters 318 (e.g., one that specifies the vendor specific address location regions). In some embodiments, the adjustable parameters 318 can toggle on or off this overwrite capability or set the default to on or off. Accordingly, the adjustable parameters 318 command can maintain a degree of backward compatibility. Said differently, the Feature can be set to on or default to on in cases where two-terminal memory is present, but set to off or default to off in cases where controller 304 is coupled to NAND flash memory, for example.

In some embodiments, vendor adjustable parameters 318 can relate to the concept or properties of erasing a block of memory. The smallest region of memory that NAND flash memory is capable of erasing is a block. As previously noted, two terminal memory can erase (e.g., set memory to a particular state) for smaller regions of memory such as a page or even a single bit. Thus, an associated adjustable parameters 318 command can set or set as default two-terminal compatible erase commands. For example, when set, controller 304 can issue multiple page erase commands to facilitate a conventional NAND flash memory block erase.

In some embodiments, adjustable parameters 318 can relate to properties with garbage collection routines. As discussed herein, two-terminal memory supports overwrite functionality and is not subject to many of the limitations of NAND flash memory. For example, NAND flash memory writes/programs on the page level, but erases only on the block level. NAND flash memory also requires an erase prior to a write for a particular memory cell, and recommends that only a single write within a given page can be accomplished without a subsequent erase of the entire block to avoid write disturb errors. These and other features of NAND flash memory result in relatively extensive garbage collection that is typically handled by controller 102 or another controller. Since two-terminal memory is not subject to many of the causes that result in the need for garbage collection, such garbage collection can be avoided or reduced, which can reduce associated overhead. In this regard, an adjustable parameters 318 function can be provided to deactivate all or certain types of garbage collection that can be advantageously utilized by two-terminal memory arrangements.

In some embodiments, adjustable parameters 318 can relate to concepts or properties associated with ECC routines. As discussed herein, typical NAND flash memory devices utilize a variety of ECC algorithms. One of the most commonly used ECC algorithms is Bose-Chaudhuri (BCH) code. Recently, more advanced algorithms, low-density parity check (LDPC) have been introduced. Generally, LDPC is significantly more efficient than BCH or others, but the efficiency of LDPC is sub-linearly related to the number of errors in the data being checked by ECC. Since NAND flash memory typically has a relatively high BER, if the number of errors is too high, LDPC algorithms become less efficient than others. In contrast, two-terminal memory, with a significantly lower BER can improve the efficiency of LDPC algorithms (e.g., due to a lower BER) and further can be more certain that LDPC algorithms can be successfully utilized over the expected life of device 300. In this regard, ECC overhead can be reduced by, e.g., an adjustable parameters 318 function that selects the most efficient ECC algorithms in connection with two-terminal memory.

In some embodiments, adjustable parameters 318 can relate to concepts or properties associated with block management procedures and/or a memory health indicator. As discussed herein, typical NAND flash memory devices utilize block management elements to store a history of bad blocks of memory so that those blocks with failures are not used in connection with memory operations. In NAND-based implementations, memory health indicators can be employed to predict when certain cells, pages, or blocks will fail, in which case these blocks can be marked as bad. Two-terminal memory generally has a significantly higher endurance, and therefore can reduce overhead relating to block management and health indicator analysis. Such overhead can relate to storage required for recording bad blocks, lost capacity of memory elements with bad blocks, processing to detect bad blocks, processing to predict bad blocks and so on. In cases where two-terminal memory does not utilize a prediction-based health monitor, failure can still be detected (and corrected) by ECC operations, and the failure marked by block management elements. In this regard, an adjustable parameters 318 function can be provided that selects block management and/or health indicator functions that are more advantageous in connection with two-terminal memory. As with other functions detailed herein, such can be backward compatible with NAND by turning the function off with, e.g., the same or a different adjustable parameters 318 function.

In some embodiments, adjustable parameters 318 can relate to concepts or properties associated with pagination for multi-level cell (MLC) arrangements. Most NAND flash memory devices today are architected according to a multi-level cell arrangement, wherein a single memory cell can store more than one bit of information. Due to the capacitive coupling of the floating gate NAND flash memory architecture, MLC arrangements initially had many disturb issues. One solution for MLC arrangements was to logically define the multiple bits of a cell as belonging to different pages of memory. This virtual solution was successful in reducing disturb issues associated with MLC NAND flash memory, but required that two or more bits that are physically adjacent or in fact belonging to the same memory cell are logically separated by an entire page of memory. One consequence of this arrangement is that sensing operations are slower than otherwise necessary since page-based operations proceed sequentially and one bit is required to be on a different page than another and therefore at least one bit of a cell must take a longer time for the sensing operation. Since two-terminal memory does not share similar disturb issues, all bits in an MLC arrangement can be on the same page and even logically adjacent, which is more intuitive, will not increase timing for sensing operations in such an arrangement, and can reduce L2P overhead. In this regard, an adjustable parameters 318 function can be provided that can select between conventional pagination where MLC bits are logically on different pages that is compatible with NAND and two-terminal memory and pagination where MLC bits are on the same page which is not compatible with NAND but is compatible with two-terminal memory arrangements.

In some embodiments, adjustable parameters 318 can relate to the concept or properties of adjusting a page size, which is described in connection with FIG. 7. For example, device 300 can include one or more registers that temporarily store data being read from a memory module 302 and transmitted to controller 304 or received from controller 304 and written to memory module 302. Controller 304 can retrieve data from or populate these register(s) irrespective of a setting relating to page size. For instance, consider a typical NAND-based page size of two kilobytes. In that case, a given register will commonly be capable of storing approximately two kilobytes of data for read and write operations. For NAND flash memory, the size of a page of data is linked to physical characteristics of the NAND flash memory. Yet, host applications often make different presumptions about page size. For instance, mobile applications typically presume a page size of 512 bytes to two kilobytes whereas a page size for desktop applications can be much larger. Controller 304 can mitigate associated difficulties by providing a configurable page size that can be better suited to a larger set of host applications. In some embodiments, the configurable page size can be accomplished by selecting a relatively small page size. If the host application expects or is optimized by a larger page size, then multiple page reads can be performed to emulate a single, larger page size. Generally, these multiple page reads can be performed at speeds faster than can be achieved with a NAND flash memory page read. However, since two-terminal memory can support configurable page sizes, improved compatibility can be achieved with host applications. In cases where the host is a mobile application that expects a page size of, e.g., 512 bytes, the page size can be set to 512 bytes. In cases where the host is a desktop application that expects a larger page size, the page size can be set to a larger value, typically up to the limits of the register(s). As one example, such can be accomplished via an adjustable parameters 318 command that sets the page size to a suitable or supported value. As with other examples detailed herein, such can include a backward compatibility option to be compatible with NAND flash memory.

Turning now to FIG. 6, device 600 is depicted. Device 600 illustrates an example multi-level cell (MLC) and various examples of an associated MLC pagination scheme. In some embodiments, the array of two-terminal memory (e.g., included in memory modules 302 of FIG. 3) can comprise one or more multi-level cell(s) 602. An MLC 602 can be characterized by various states of the cell representing multiple bits of data. In conventional single-level cells, the state of cell is sensed and thus determined to be in an "off" state or an "on" state (e.g., based on conductance or another electrical characteristic), which are then mapped to a "0" or a "1" and thus capable of representing a single bit of information. Due to improvements to sensing margins or other innovations, a single cell can be used to represent more than a single bit by the ability to sense more than two distinct states. In this example, sensing can distinguish four separate states of MLC 602 and thus store up to two bits of information. However, it is understood that MLC 602, in other examples, can store more than two bits of information, typically based on the function: $n=2^b$, where n is the number of distinct states the sensing is capable of distinguishing and b is the number of bits represented by MLC 602, denoted herein as multiple bits 604. Since b=2 in this example, a first bit of multiple bits 604 is labeled as $604_1$ and a second bit of multiple bits 604 is labeled $604_2$.

In some embodiments, adjustable parameters 318 can relate to a first setting for a configurable MLC pagination scheme that defines whether all or a portion of the multiple bits 604 of data are included in a single page of virtual memory. In this regard, FIG. 6 further illustrates various example MLC pagination schemes that are based on the first setting and/or adjustable parameters 318. In the first example, the multiple bits 604 are contiguous in a single page 606 of virtual memory. Here, the first bit $604_1$ is mapped to the first bit in page 606 and the second bit $604_2$ is mapped to the second bit in page 606. It is understood that the multiple bits 604 of cell 602 may be mapped to other locations of page 606 and/or might be reversed such that second bit $604_2$ sequentially precedes first bit $604_1$ in page 606, but regardless of the implementation, bits $604_1$ and $604_2$ are contiguous or sequential in page 606. As introduced above, such an arrangement is not feasible for other types of memory (e.g., NAND flash memory) due to the potential for bit disturb errors that are likely to arise.

In the second example, the multiple bits 604 are not contiguous, but still in the single page 606 of virtual memory. Here, the first bit $604_1$ is mapped to the first bit in page 606 and the second bit $604_2$ is mapped to another bit in page 606 with potentially many (e.g., a byte) bits between. It is understood that the multiple bits 604 of cell 602 may be mapped to other locations of page 606 and/or might be reversed such that second bit $604_2$ sequentially precedes first bit $604_1$ in page 606, but regardless of the implementation, bits $604_1$ and $604_2$ are noncontiguous or non-sequential in page 606. Again, due to the potential for bit disturb errors that are likely to arise, such an arrangement is not feasible for other types of memory (e.g., NAND flash memory). In the third example, the multiple bits 604 are distributed among multiple pages of virtual memory. In this instance, the first bit $604_1$ is mapped to the first bit in a first page $606_1$ and the second bit $604_2$ is mapped to the first bit in a second page $606_2$.

Figure 7:
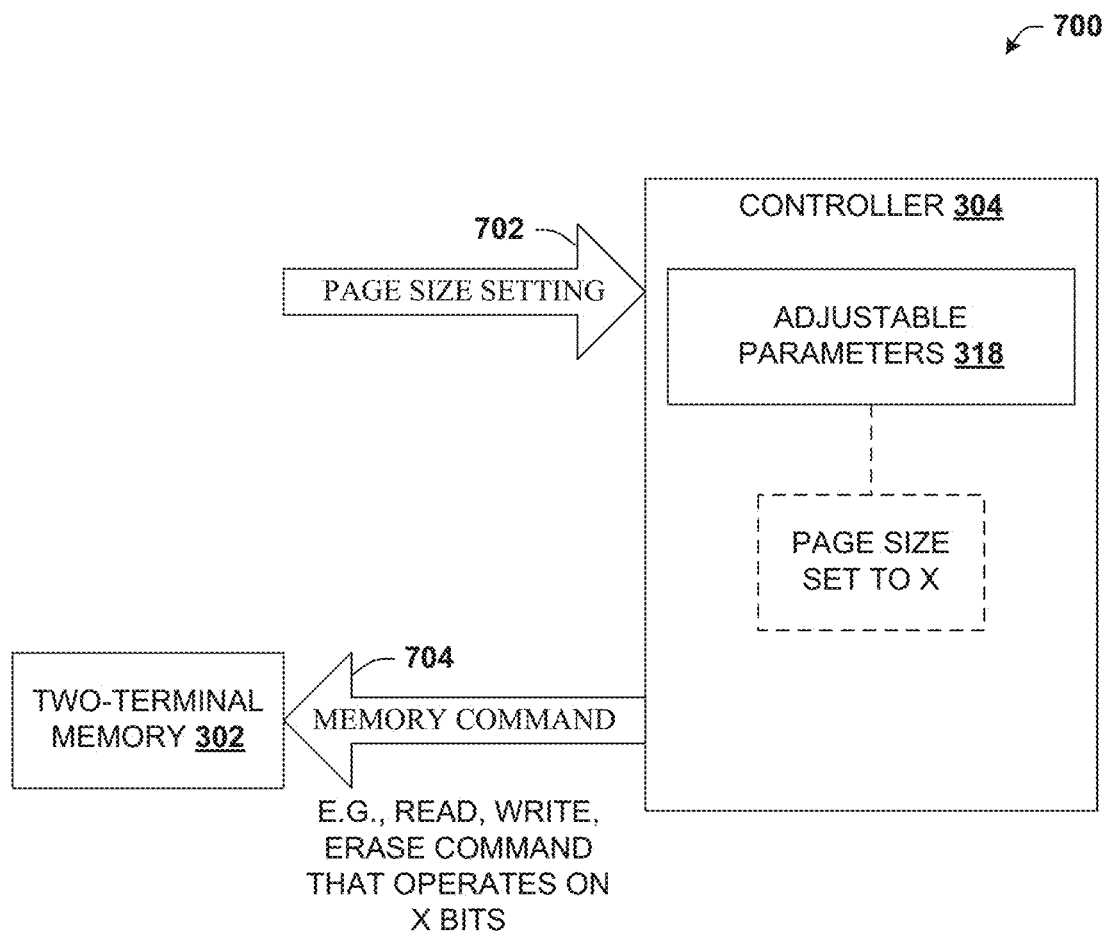
FIG. 7 illustrates an example system that can provide for an adjustable page size in connection with low-level memory commands in accordance with certain embodiments of this disclosure.

With reference now to FIG. 7, system 700 is depicted. System 700 can provide for an adjustable page size in connection with low-level memory commands. System 700 can include controller 304 as substantially described supra, with adjustable parameters 318. As noted previously, adjustable parameters 318 can include a post-fabrication option that can be updated to modify a default page size. For example, page size setting 702 can be received by controller 304 along with data defining a page size. The page size can establish a smallest number of memory bits upon which a low-level memory data access command operates. For instance, a low-level read operation can read a page of memory at a time, whereas a low-level write operation can write a page of memory at a time. Based on page size setting 702, the page size can be configured to substantially any value, denoted here as x. In some embodiments, x may be limited by architecture, but in the general case, x can be substantially any value from a single bit to several megabytes or more. Factors that may limit the smallest value of x might relate to the addressing capability of the architecture (e.g., can be a single bit addressable). Two-terminal memory is capable of single-bit addressability, but design trade-offs for some embodiments may forego this capability for other benefits. In such two-terminal memory, very small values for x, typically much smaller than page sizes or granularities of conventional systems can be achieved. Factors that may limit the largest values of x may relate to size or throughput associated with registers used to transfer data to and from two-terminal memory 302.

As noted herein, host applications often make different presumptions about page size. For instance, mobile applications typically presume a page size of 512 bytes to two kilobytes whereas a page size for desktop applications can be much larger. Controller 304 can mitigate associated difficulties by providing a configurable page size that can be better suited to a larger set of host applications. In some embodiments, the configurable page size can be accomplished by selecting a relatively small page size. If the host application expects or is optimized by a larger page size, then multiple page reads can be performed to emulate a single, larger page size. Generally, these multiple page reads can be performed at speeds faster than can be achieved with a NAND flash memory page operations. However, since two-terminal memory can support configurable page sizes, improved compatibility can be achieved with host applications. In cases where the host is a mobile application that expects a page size of, e.g., 512 bytes, the page size can be set to 512 bytes. In cases where the host is a desktop application that expects a larger page size, the page size can be set to a larger value, typically up to the limits of the register(s).

In this regard, controller 304 can maintain a designated page size, which can be modified by, e.g., page size setting 702. Thus, when controller receives a high-level memory command (e.g., from a host device), that high-level memory command can be translated to a corresponding low-level memory 704 that operates on x bits.

Example Methods for Setting Memory Operational Characteristics

The diagrams included herein are described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

Figure 8:
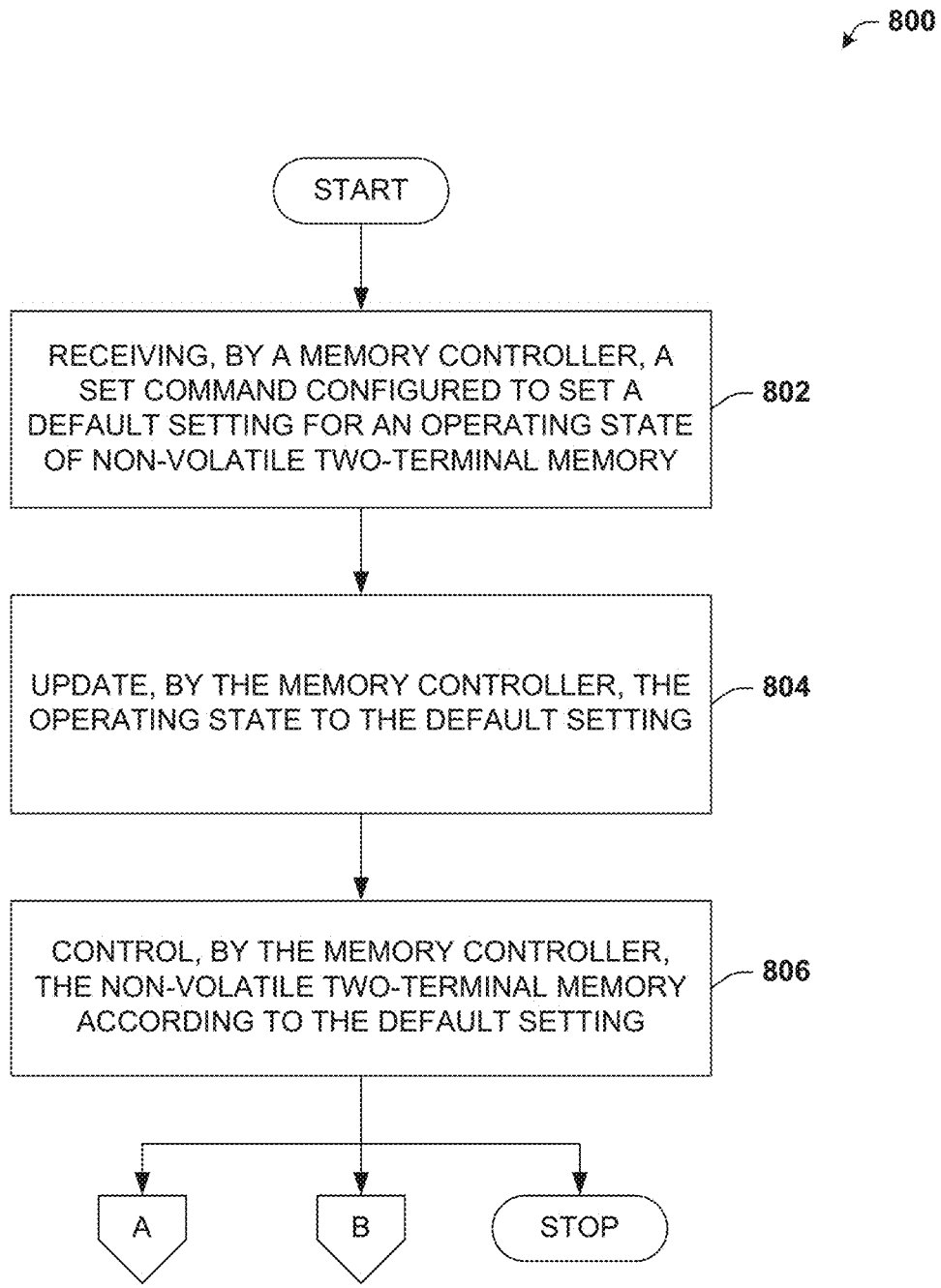
FIG. 8 illustrates an example methodology that can provide for adjustable parameters that can be set post-fabrication to modify operating characteristics of two-terminal memory in accordance with certain embodiments of this disclosure.
Figure 9:
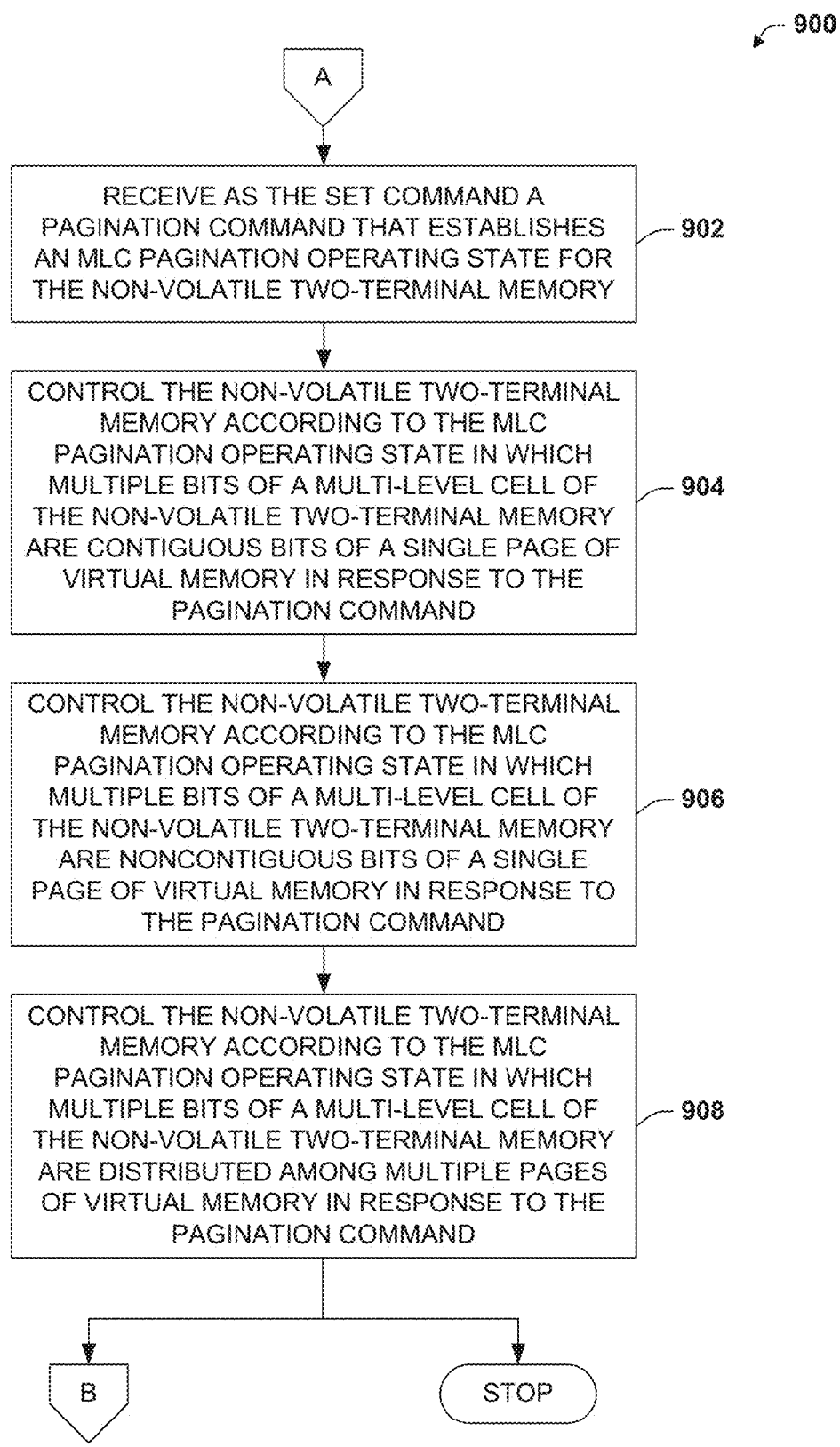
FIG. 9 illustrates an example methodology that can provide for a multi-level cell (MLC) pagination scheme for the non-volatile two-terminal in accordance with certain embodiments of this disclosure.
Figure 10:
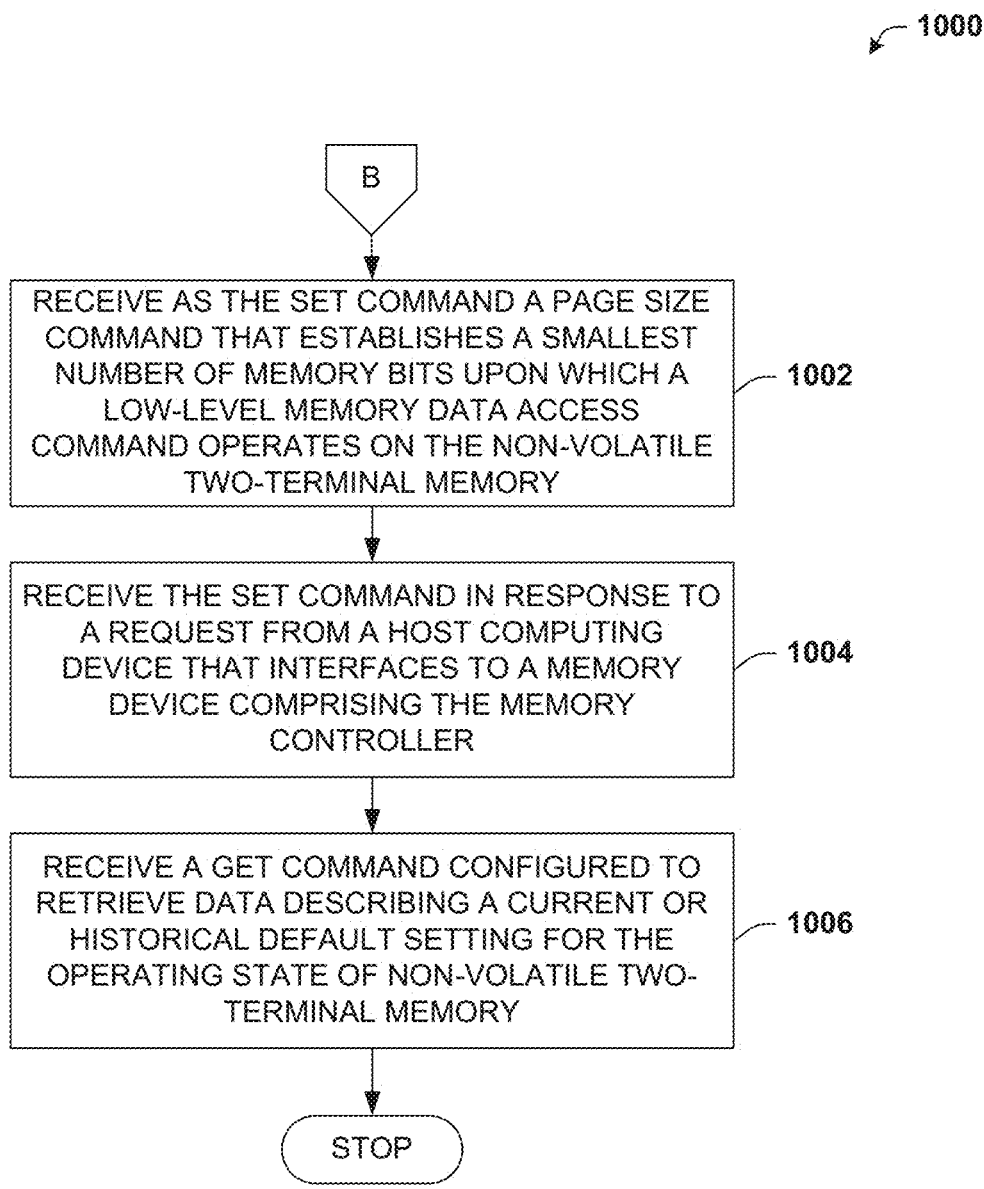
FIG. 10 illustrates an example methodology that can provide for additional aspects or elements in connection with adjustable parameters that can be set post-fabrication to modify operating characteristics of two-terminal in accordance with certain embodiments of this disclosure.

In view of the exemplary diagrams described supra, process methods that can be implemented in accordance with the disclosed subject matter will be better appreciated with reference to the flow charts of FIGS. 8-10. While for purposes of simplicity of explanation, the methods of FIGS. 8-10 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Referring now to FIG. 8, exemplary method 800 is illustrated. Method 800 can provide for adjustable parameters that can be set post-fabrication to modify operating characteristics of two-terminal memory. At reference numeral 802, a memory controller can receive a set command configured to set a default setting for an operating state of non-volatile two-terminal memory. The memory controller can be included in a two-terminal memory device (e.g., a memory card, etc.) and the set command can be received from a host device (e.g., laptop, phone, camera, etc.) that interfaces to the two-terminal memory device.

At reference numeral 804, the memory device can be configured to update the operating state of the two-terminal memory and/or the memory device to the default setting included in the set command received at reference numeral 802. At reference numeral 806, the memory device can be configured to control the non-volatile two-terminal memory according to the default setting. Method can continue to insert A detailed in connection with FIG. 9, to insert B detailed in connection with FIG. 10, or end.

Turning now to FIG. 9, method 900 is illustrated. Method 900 can provide for a multi-level cell (MLC) pagination scheme for the non-volatile two-terminal memory. At reference numeral 902, the memory controller detailed in connection with method 800 of FIG. 8 can receive as the set command a pagination command that establishes an MLC pagination operating state for the non-volatile two-terminal memory. Such can be advantages in embodiments in which the non-volatile two-terminal memory includes MLC architecture.

At reference numeral 904, the non-volatile two-terminal memory can be controlled in response to the pagination command. In these embodiments, control of the non-volatile two-terminal memory can be according to the MLC pagination operating state in which multiple bits of a multi-level cell of the non-volatile two-terminal memory are contiguous bits of a single page of virtual memory.

At reference numeral 906, the non-volatile two-terminal memory can be controlled in response to the pagination command. In these embodiments, control of the non-volatile two-terminal memory can be according to the MLC pagination operating state in which multiple bits of a multi-level cell of the non-volatile two-terminal memory are noncontiguous bits of a single page of virtual memory.

At reference numeral 908, the non-volatile two-terminal memory can be controlled in response to the pagination command. In these embodiments, control of the non-volatile two-terminal memory can be according to the MLC pagination operating state in which multiple bits of a multi-level cell of the non-volatile two-terminal memory are distributed among multiple pages of virtual memory. Method 900 can proceed to insert B continued at FIG. 10, or end.

FIG. 10 depicts method 1000. Method 1000 can provide for additional aspects or elements in connection with adjustable parameters that can be set post-fabrication to modify operating characteristics of two-terminal memory. At reference numeral 1002, the set command can be a page size command. This page size command can establish a smallest number of memory bits upon which a low-level memory data access command operates on the non-volatile two-terminal memory.

At reference numeral 1004, the set command can be received in response to a request from a host computing device that interfaces to the memory device comprising the memory controller. At reference numeral 1006, a get command can be received. This get command can be configured to retrieve data describing a current or historical default setting for the operating state of the non-volatile two-terminal memory.

Example Operating Environments

Figure 11:
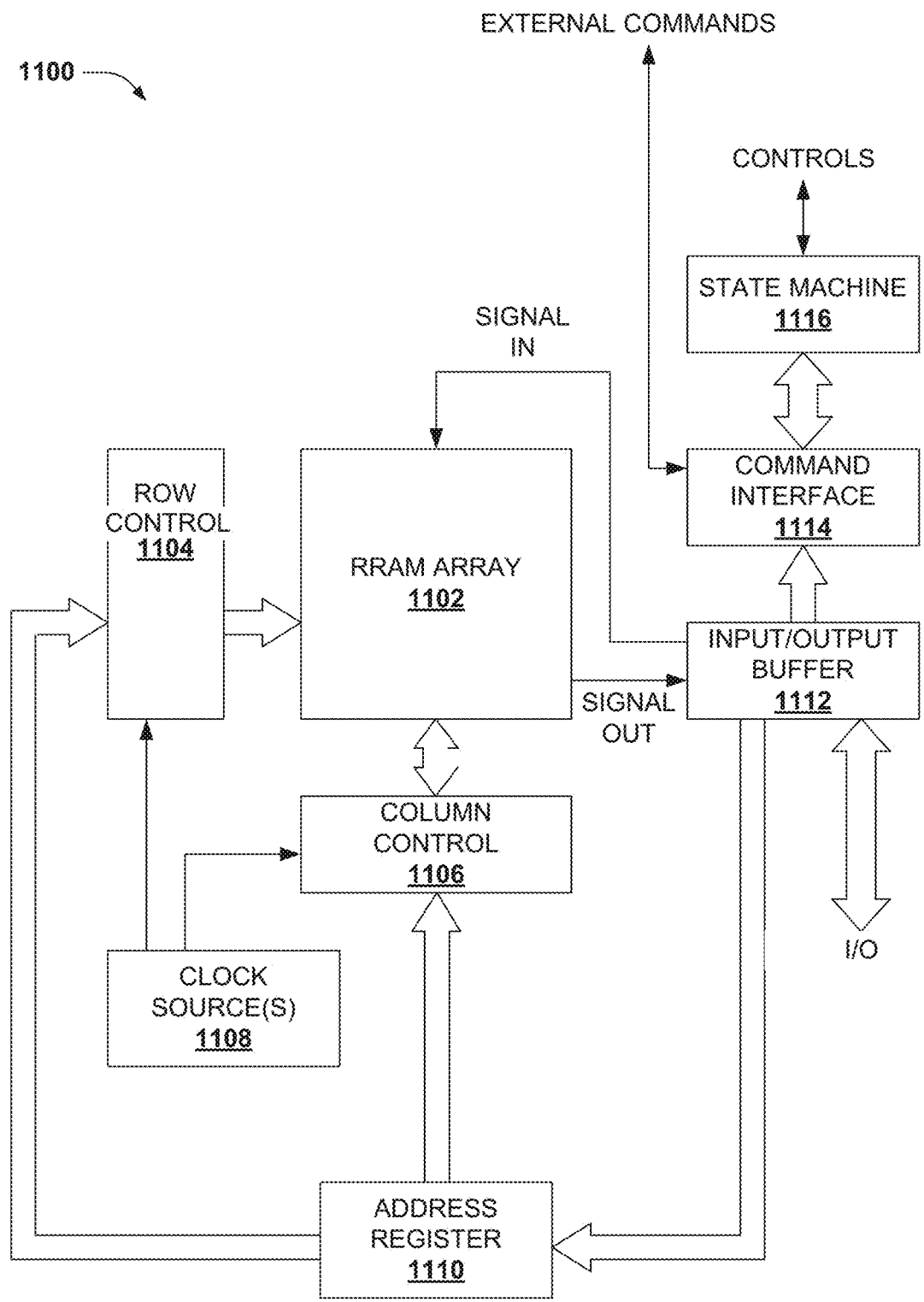
FIG. 11 illustrates a block diagram of an example electronic operating environment in accordance with certain embodiments of this disclosure.

In order to provide a context for the various aspects of the disclosed subject matter, FIG. 11, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 11 illustrates a block diagram of an example operating and control environment 1100 for a RRAM array 1102 according to aspects of the subject disclosure. In at least one aspect of the subject disclosure, RRAM array 1102 can comprise a variety of RRAM memory cell technology. Particularly, RRAM array can be configured or operated to mitigate or avoid sneak path currents of the RRAM array, as described herein.

A column controller 1106 can be formed adjacent to RRAM array 1102. Moreover, column controller 1106 can be electrically coupled with bit lines of RRAM array 1102. Column controller 1106 can control respective bitlines, applying suitable program, erase or read voltages to selected bitlines.

In addition, operating and control environment 1100 can comprise a row controller 1104. Row controller 1104 can be formed adjacent to column controller 1106, and electrically connected with word lines of RRAM array 1102. Row controller 1104 can select particular rows of memory cells with a suitable selection voltage. Moreover, row controller 1104 can facilitate program, erase or read operations by applying suitable voltages at selected word lines.

A clock source(s) 1108 can provide respective clock pulses to facilitate timing for read, write, and program operations of row control 1104 and column control 1106. Clock source(s) 1108 can further facilitate selection of word lines or bit lines in response to external or internal commands received by operating and control environment 1100. An input/output buffer 1112 can be connected to an external host apparatus, such as a computer or other processing device (not depicted) by way of an I/O buffer or other I/O communication interface. Input/output buffer 1112 can be configured to receive write data, receive an erase instruction, output readout data, and receive address data and command data, as well as address data for respective instructions. Address data can be transferred to row controller 1104 and column controller 1106 by an address register 1110. In addition, input data is transmitted to RRAM array 1102 via signal input lines, and output data is received from RRAM array 1102 via signal output lines. Input data can be received from the host apparatus, and output data can be delivered to the host apparatus via the I/O buffer.

Commands received from the host apparatus can be provided to a command interface 1114. Command interface 1114 can be configured to receive external control signals from the host apparatus, and determine whether data input to the input/output buffer 1112 is write data, a command, or an address. Input commands can be transferred to a state machine 1116.

State machine 1116 can be configured to manage programming and reprogramming of RRAM array 1102. State machine 1116 receives commands from the host apparatus via input/output interface 1112 and command interface 1114, and manages read, write, erase, data input, data output, and like functionality associated with RRAM array 1102. In some aspects, state machine 1116 can send and receive acknowledgments and negative acknowledgments regarding successful receipt or execution of various commands.

To implement read, write, erase, input, output, etc., functionality, state machine 1116 can control clock source(s) 1108. Control of clock source(s) 1108 can cause output pulses configured to facilitate row controller 1104 and column controller 1106 implementing the particular functionality. Output pulses can be transferred to selected bit lines by column controller 1106, for instance, or word lines by row controller 1104, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In connection with FIG. 12, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 12:
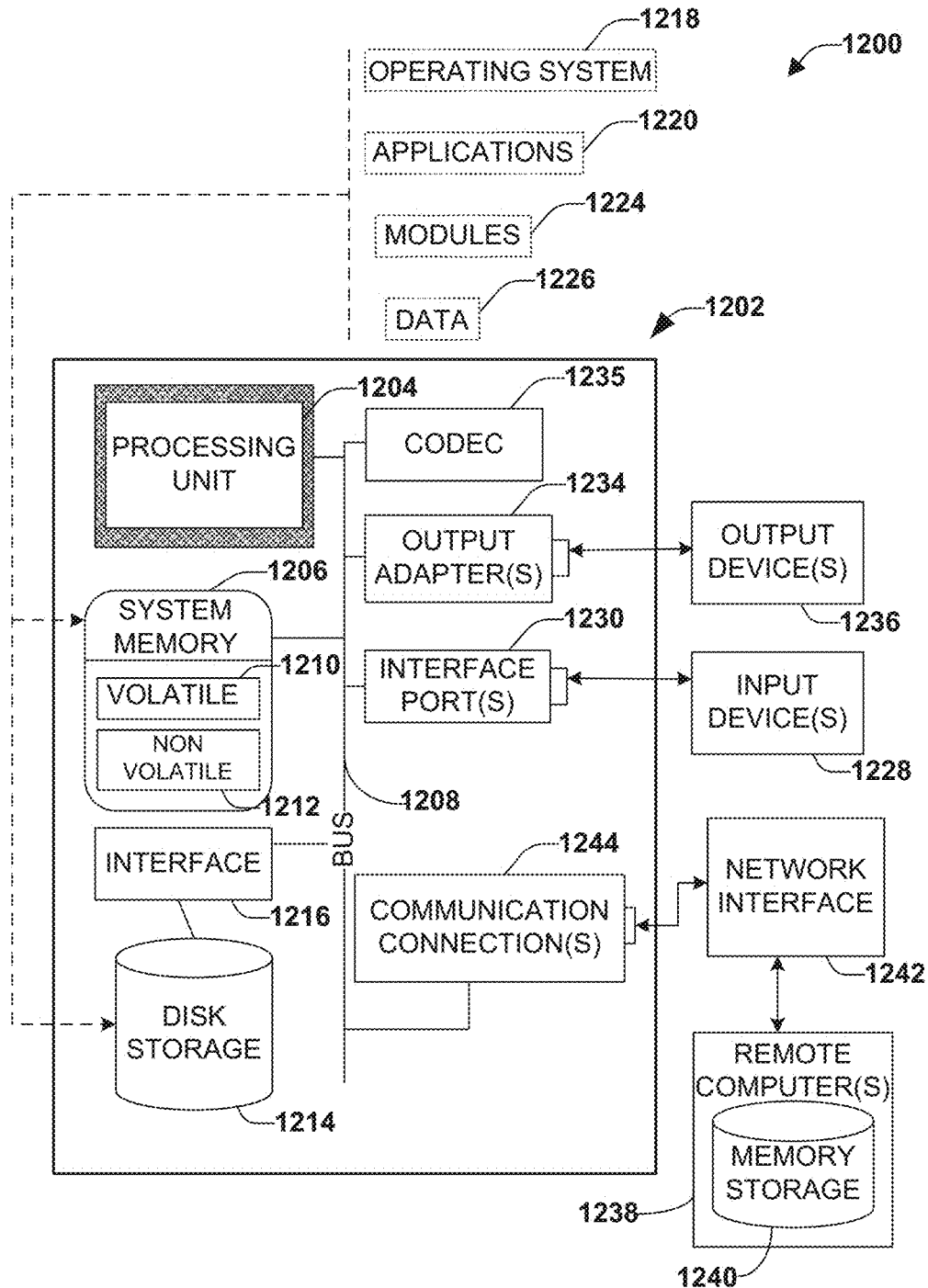
FIG. 12 illustrates a block diagram of an example computing environment in accordance with certain embodiments of this disclosure.

With reference to FIG. 12, a suitable environment 1200 for implementing various aspects of the claimed subject matter includes a computer 1202. The computer 1202 includes a processing unit 1204, a system memory 1206, a codec 1235, and a system bus 1208. The system bus 1208 couples system components including, but not limited to, the system memory 1206 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1206 includes volatile memory 1210 and non-volatile memory 1212. The basic input/output system (BIOS), containing the basic routines to transfer information between elements within the computer 1202, such as during start-up, is stored in non-volatile memory 1212. In addition, according to present innovations, codec 1235 may include at least one of an encoder or decoder, wherein the at least one of an encoder or decoder may consist of hardware, software, or a combination of hardware and software. Although, codec 1235 is depicted as a separate component, codec 1235 may be contained within non-volatile memory 1212. By way of illustration, and not limitation, non-volatile memory 1212 can include read only memory (ROM), programmable ROM (PROM), electrically programmable ROM (EPROM), electrically erasable programmable ROM (EEPROM), or flash memory. Volatile memory 1210 includes random access memory (RAM), which acts as external cache memory. According to present aspects, the volatile memory may store the write operation retry logic (not shown in FIG. 12) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1202 may also include removable/non-removable, volatile/non-volatile computer storage medium. FIG. 12 illustrates, for example, disk storage 1214. Disk storage 1214 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1214 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1214 to the system bus 1208, a removable or non-removable interface is typically used, such as interface 1216. It is appreciated that storage devices 1214 can store information related to a user. Such information might be stored at or provided to a server or to an application running on a user device. In one embodiment, the user can be notified (e.g., by way of output device(s) 1236) of the types of information that are stored to disk storage 1214 and/or transmitted to the server or application. The user can be provided the opportunity to opt-in or opt-out of having such information collected acid/or shared with the server or application (e.g., by way of input from input device(s) 1228).

It is to be appreciated that FIG. 12 describes software that acts as an intermediary between users and the basic computer resources described in the suitable operating environment 1200. Such software includes an operating system 1218. Operating system 1218, which can be stored on disk storage 1214, acts to control and allocate resources of the computer system 1202. Applications 1220 take advantage of the management of resources by operating system 1218 through program modules 1224, and program data 1226, such as the boot/shutdown transaction table and the like, stored either in system memory 1206 or on disk storage 1214. It is to be appreciated that the claimed subject matter can be implemented with various operating systems or combinations of operating systems.

A user enters commands or information into the computer 1202 through input device(s) 1228. Input devices 1228 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via interface port(s) 1230. Interface port(s) 1230 include, for example, a serial port, a parallel port, a game port, and a universal serial bus (USB). Output device(s) 1236 use some of the same type of ports as input device(s) 1228. Thus, for example, a USB port may be used to provide input to computer 1202 and to output information from computer 1202 to an output device 1236. Output adapter 1234 is provided to illustrate that there are some output devices 1236 like monitors, speakers, and printers, among other output devices 1236, which require special adapters. The output adapters 1234 include, by way of illustration and not limitation, video and sound cards that provide a means of connection between the output device 1236 and the system bus 1208. It should be noted that other devices and/or systems of devices provide both input and output capabilities such as remote computer(s) 1238.

Computer 1202 can operate in a networked environment using logical connections to one or more remote computers, such as remote computer(s) 1238. The remote computer(s) 1238 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1240 is illustrated with remote computer(s) 1238. Remote computer(s) 1238 is logically connected to computer 1202 through a network interface 1242 and then connected via communication connection(s) 1244. Network interface 1242 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1244 refers to the hardware/software employed to connect the network interface 1242 to the bus 1208. While communication connection 1244 is shown for illustrative clarity inside computer 1202, it can also be external to computer 1202. The hardware/software necessary for connection to the network interface 1242 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory device, comprising:
   a two-terminal memory host interface configured to communicate with a host device;
   at least one memory module comprising an array of non-volatile two-terminal memory cells configured to operate according to a set of default operating characteristics; and
   a two-terminal memory controller communicatively connected to the at least one memory module and to the two-terminal memory host interface, and configured to control operational characteristics of the array of non-volatile two-terminal memory cells and to be optimized for two-terminal memory, and that:
      receives from the host device via the two-terminal memory host interface set command data comprising a first instruction to set a post-fabrication adjustable parameter of a set of post-fabrication adjustable parameters to a defined value, wherein the post-fabrication adjustable parameter is optimized for at least one default operating characteristic for two-terminal memory adjustable after fabrication of the memory device to modify a function of the at least one default operating characteristic of the set of default operating characteristics;
      sets the adjustable parameter to the defined value; and controls the at least one memory module according to the adjustable parameter.

2. The memory device of claim 1, wherein the post-fabrication adjustable parameter is selected from a group consisting of: a timing characteristic for the at least one memory module, a voltage characteristic for the at least one memory module, and an amperage characteristic for the at least one memory module.

3. The memory device of claim 1, wherein the set command data comprises the defined value and the first instruction.

4. The memory device of claim 1, wherein the two-terminal memory controller is further configured to:
receive from the host device get command data comprising a second instruction to return data indicative of the defined value of the adjustable parameter;
determine the defined value; and
transmit the data indicative of the defined value to the host device.

5. The memory device of claim 1, wherein the array of non-volatile two-terminal memory cells comprises a multi-level cell (MLC) characterized by a set of measurably distinct states representing multiple bits of data.

6. The memory device of claim 5, wherein the adjustable parameter relates to a setting for a configurable MLC pagination scheme that defines at least two of the multiple bits of data to be included in a single page of virtual memory.

7. The memory device of claim 6, wherein the at least two of the multiple bits of data are contiguous bits in the single page of virtual memory.

8. The memory device of claim 6, wherein the at least two of the multiple bits of data are non-contiguous bits in the single page of virtual memory.

9. The memory device of claim 6, wherein the two-terminal memory controller has a first mode setting in which the two-terminal memory controller is configured to control non-volatile three-terminal flash memory and has a second mode setting in which the two-terminal memory controller is configured to control at least in part the at least one memory module comprising the array of non-volatile two-terminal memory.

10. The memory device of claim 1, wherein the post-fabrication adjustable parameter relates to a setting for a configurable page size that establishes a smallest number of memory bits upon which a low-level memory data access command operates.

11. The memory device of claim 10, wherein the setting establishes the smallest number of memory bits for the configurable page size to one byte of memory.

12. A memory, comprising:
a two-terminal memory host interface that facilitates communication with a host device;
an array of memory comprising a set of non-volatile two-terminal memory cells;
storage memory having stored therein a set of programmable operating states having respective sets of operating parameters optimized for the non-volatile two-terminal memory cells and that define operation of the array of memory, the set of programmable operating states comprising a default operating state; and
a two-terminal memory controller communicatively coupled to the two-terminal memory host interface, the array of memory and the storage memory, configured to optimally control operational characteristics of the non-volatile two-terminal memory cells and further configured to:
receive a set command over the two-terminal memory host interface, wherein the set command indicates one of the set of programmable operating states for the array of memory; and
activate the one of the set of programmable operating states.

13. The memory of claim 12, wherein the two-terminal memory controller sets the default operating state to the one of the set of programmable operating states.

14. The memory of claim 12, wherein the two-terminal memory controller is further configured to provide data relating to the default operating state in response to a get command received over the two-terminal memory host interface.

15. The memory of claim 12, wherein the set of programmable operating states differ from one another based on a setting selected from a group of settings consisting essentially of: a timing setting, a voltage setting, and an amperage setting.

16. The memory of claim 12, wherein the one of the set of programmable operating states comprises a multi-level cell (MLC) pagination setting that maps multiple bits included in an MLC to corresponding bits of a page of memory based on the MLC pagination setting.

17. The memory of claim 16, wherein the MLC pagination setting maps the multiple bits to sequential bits of a single page of memory.

18. The memory of claim 16, wherein the MLC pagination setting maps the multiple bits to non-sequential bits of a single page of memory.

19. The memory of claim 12, wherein the set of programmable operating states comprises a page size setting that differs from the default operating state.

20. A method, comprising:
receiving, by a two-terminal memory controller, a set command from a host device that is operatively coupled to a memory device comprising the two-terminal memory controller, wherein the two-terminal memory controller is configured to set a default setting for one of multiple settings of an operating state configured to be optimal for non-volatile two-terminal memory to a target setting, of the multiple settings, and wherein the set command comprises an indication of the target setting;
updating the operating state to the target setting; and
controlling the non-volatile two-terminal memory according to the target setting.

21. The method of claim 20, further comprising receiving, as the set command, a pagination command that indicates an MLC pagination operating state for the non-volatile two-terminal memory.

22. The method of claim 21, further comprising controlling the non-volatile two-terminal memory according to the MLC pagination operating state in which multiple bits of a multi-level cell of the non-volatile two-terminal memory are contiguous bits of a single page of virtual memory in response to the pagination command.

23. The method of claim 21, further comprising controlling the non-volatile two-terminal memory according to the MLC pagination operating state in which multiple bits of a multi-level cell of the non-volatile two-terminal memory are noncontiguous bits of a single page of virtual memory in response to the pagination command.

24. The method of claim 21, further comprising controlling the non-volatile two-terminal memory according to the MLC pagination operating state in which multiple bits of a multi-level cell of the non-volatile two-terminal memory are distributed among multiple pages of virtual memory in response to the pagination command.

25. The method of claim 20, further comprising receiving, as the set command, a page size command that establishes a smallest number of memory bits upon which a low-level memory data access command operates on the non-volatile two-terminal memory.

26. The method of claim 20, further comprising receiving, from the host device, a get command that indicates a request to return data describing a current or historical setting.

27. The method of claim 26, further comprising transmitting the data to the host device.

\* \* \* \* \*